(12) United States Patent
Sung

(10) Patent No.: US 12,394,653 B2
(45) Date of Patent: Aug. 19, 2025

(54) WAFER CARRIER DISC INSTALLATION/UNINSTALLATION DEVICE AND INSTALLATION/UNINSTALLATION METHOD THEREOF

(71) Applicant: Mao-Yen Sung, Zhubei (TW)

(72) Inventor: Mao-Yen Sung, Zhubei (TW)

( * ) Notice: Subject to any disclaimer, the term of this patent is extended or adjusted under 35 U.S.C. 154(b) by 400 days.

(21) Appl. No.: 17/929,017

(22) PCT Filed: Feb. 9, 2021

(86) PCT No.: PCT/CN2021/076313
§ 371 (c)(1),
(2) Date: Aug. 10, 2022

(87) PCT Pub. No.: WO2021/164664
PCT Pub. Date: Aug. 26, 2021

(65) Prior Publication Data
US 2023/0104871 A1    Apr. 6, 2023

(30) Foreign Application Priority Data

Feb. 19, 2020  (CN) .......................... 202010102278.5
Feb. 19, 2020  (CN) .......................... 202010102312.9

(51) Int. Cl.
*H01L 21/00*   (2006.01)
*B25J 9/16*    (2006.01)
(Continued)

(52) U.S. Cl.
CPC ...... *H01L 21/67778* (2013.01); *B25J 9/1697* (2013.01); *B25J 11/0095* (2013.01);
(Continued)

(58) Field of Classification Search
None
See application file for complete search history.

(56) References Cited

U.S. PATENT DOCUMENTS 9,644,271 B1 *  5/2017  Keil .................... C23C 16/505
2008/0013089 A1 *  1/2008  Ishii ..................... G03F 9/7011
356/400

(Continued)

*Primary Examiner* — Truc M Do
(74) *Attorney, Agent, or Firm* — Rosenberg, Klein & Lee

(57) ABSTRACT

A wafer carrier disc installation/uninstallation device and an installation/uninstallation method thereof. The installation/uninstallation device includes a first robotic arm 1, a second robotic arm 2, a carrier disc 3, a main correction mechanism 4, a wafer correction mechanism 5 and a material rest mechanism 6. The carrier disc 3, the main correction mechanism 4, the wafer correction mechanism 5 and the material rest mechanism 6 are positioned within the moving range of the first and second robotic arms 1 and 2. The first robotic arm 1 drives an image capturing assembly 11 and a wafer locating member installation/uninstallation mechanism 12 to move. The second robotic arm 2 drives a wafer taking/placing mechanism 21 to move. Multiple wafer discs 31 are disposed on the carrier disc 3. The main correction mechanism 4 corrects the image capturing assembly 11, the wafer locating member installation/uninstallation mechanism 12 to true operation positions.

20 Claims, 26 Drawing Sheets

(51) Int. Cl.
  *B25J 11/00* (2006.01)
  *B25J 13/08* (2006.01)
  *H01L 21/673* (2006.01)
  *H01L 21/677* (2006.01)
  *H01L 21/68* (2006.01)
  *H01L 21/687* (2006.01)

(52) U.S. Cl.
  CPC ........ *B25J 13/08* (2013.01); *H01L 21/67326* (2013.01); *H01L 21/67766* (2013.01); *H01L 21/681* (2013.01); *H01L 21/68707* (2013.01)

(56) References Cited

U.S. PATENT DOCUMENTS

| | | | |
|---|---|---|---|
| 2008/0218772 A1* | 9/2008 | Binns | H01L 21/68 |
| | | | 356/622 |
| 2017/0162428 A1* | 6/2017 | Kinouchi | H01L 21/67092 |
| 2018/0211893 A1* | 7/2018 | Ichino | H01L 21/67011 |
| 2021/0098401 A1* | 4/2021 | Zhang | B23K 3/0623 |
| 2021/0225803 A1* | 7/2021 | Von Känel | H01L 24/75 |

* cited by examiner

WAFER CARRIER DISC INSTALLATION/UNINSTALLATION DEVICE AND INSTALLATION/UNINSTALLATION METHOD THEREOF

BACKGROUND OF THE INVENTION

1. Field of the Invention

The present invention relates generally to a wafer carrier disc installation/uninstallation device and an installation/uninstallation method thereof, and more particularly to an installation/uninstallation device and an installation/uninstallation method thereof, which can lower labor cost, enhance processing efficiency and ensure that the wafer is placed on the wafer disc in true direction at high precision.

2. Description of the Related Art

In general, the manufacturing process of integrated circuit (IC) includes two major parts: manufacturing of silicon wafer, manufacturing of integrated circuit and packaging of integrated circuit. After the silicon ingot is cut into wafers, the wafer must experience multiple complicated procedures of lithography, crystal growth, etching, mechanical grinding, etc. to complete the manufacturing of the integrated circuit. In the above manufacturing process, when the wafer goes through the procedures of test, washing, evaporation, drying and organic solvent soaking, in order to effectively secure the wafer for easy processing, the respective wafers must be first secured onto a wafer disc. Then the respective wafer discs bear and carry the respective wafers to perform the aforesaid processing operations.

It is known that the basic structure of a wafer disc is a disc body with a configuration identical to the wafer and a bearing area slightly larger than the wafer. An annular frame body is detachably disposed on the disc body to define a position for receiving the wafer. In addition, multiple latch mechanisms are arranged along the circumference of the disc body for securely holding the annular frame body and pressing the annular frame body against the circumference of the wafer to locate the wafer.

In practice, in order to mass-process the wafers at the same time, generally multiple wafer discs are disposed on a large-area carrier disc. The carrier disc can receive multiple wafer discs and move the wafer discs at the same time to the respective processing sections for different processing procedures. Accordingly, the wafer processing efficiency can be effectively enhanced as a whole.

Most of the wafers respectively have a correction mark (such as plainly cut notch) on the circumference. In addition, the respective wafer discs are disposed on the carrier disc in different positions. Therefore, it is necessary to ensure that the marks of the wafers placed on the wafer discs are positioned in true direction and angle. Moreover, the respective annular frame bodies are disposed on the wafer discs by different angles. Furthermore, due to the limitation of many factors such as the operation of the latch mechanisms is complicated, currently, the operations of taking/placing of the wafer on the wafer disc, the locating of the wafer and the positioning of the wafer are generally performed by labor. This becomes a bottleneck hard to overcome in the entire wafer processing operation. As a result, the wafer moving efficiency can be hardly enhanced as a whole.

With the gradual popularization of automatic mechanical processing, robotic arms are used to precisely place the respective wafers onto the wafer discs of the carrier disc and secure the wafers. This not only greatly saves labor, but also lowers the production cost and enhances the processing efficiency. However, the wafer itself is extremely fragile and apt to damage in the moving procedure and requires very high processing precision. Therefore, it is critical how to overcome the shortcoming that the wafer material is fragile and meet the operation requirement of the robotic arms for placing the respective wafers as well as precisely correct the moving direction of the wafers.

It is therefore tried by the applicant to provide a wafer carrier disc installation/uninstallation device and an installation/uninstallation method thereof to eliminate the above shortcoming existing in the conventional wafer taking/placing device and method for placing the wafers onto the wafer discs.

SUMMARY OF THE INVENTION

It is therefore a primary object of the present invention to provide a wafer carrier disc installation/uninstallation device and an installation/uninstallation method thereof. An image capturing assembly and a wafer locating member installation/uninstallation mechanism are disposed on a first robotic arm in an installation/uninstallation region. A wafer taking/placing mechanism is disposed on a second robotic arm. A carrier disc, a main correction mechanism, a wafer correction mechanism and a material rest mechanism are respectively positioned within the moving range of the first and second robotic arms. The first robotic arm serves to drive the image capturing assembly to move to the upper side of the main correction mechanism to correct the precision of the image capturing range thereof. The first robotic arm also serves to drive the wafer locating member installation/uninstallation mechanism to move to the upper side of the main correction mechanism to correct the operation position thereof. In addition, a control module stores the relative position coordinate between the operation position of the wafer locating member installation/uninstallation mechanism and the image capturing range of the image capturing assembly. Then the image capturing assembly is moved to the upper side of the carrier disc to obtain the image of one of the wafer discs on the carrier disc and adjust the same to a true corresponding position.

With reference to the relative position coordinate obtained in the above operation, the first robotic arm drives the wafer locating member installation/uninstallation mechanism to be aligned with the wafer disc. Then the wafer locating member installation/uninstallation mechanism takes off the wafer locating member previously secured on the circumference of the wafer disc. Then the second robotic arm drives the wafer taking/placing mechanism to move to the upper side of the main correction mechanism to correct the operation position of the wafer taking/placing mechanism. The wafer taking/placing mechanism takes out the wafer to be processed from the material rest mechanism and places the wafer onto the wafer correction mechanism so as to obtain the code of the wafer to be processed and adjust the notch of the wafer to be processed to a true angle. Then the wafer taking/placing mechanism moves the wafer to be processed onto the wafer disc. Then, the first robotic arm drives the image capturing assembly to move to the upper side of carrier disc to check whether the wafer to be processed on the wafer disc is complete. Then the wafer locating member installation/uninstallation mechanism is driven to connect the wafer locating member on the wafer disc and press the wafer locating member against the circumference of the wafer to be processed and locate the same. Then, according to the above steps, a set number of wafers are respectively pressed and secured in all the wafer discs on the carrier disc. Then the carrier disc is moved outward or moved to a position for the next processing procedure. After the wafers to be processed on the respective wafer discs are completely processed, the carrier disc is moved back to its home position for uninstallation operation.

When uninstalled, the first robotic arm drives the image capturing assembly to move to the upper side of the carrier disc and obtain the image of the wafer disc on the carrier disc and adjust the same to a true corresponding position. Then the first robotic arm drives the wafer locating member installation/uninstallation mechanism to be aligned with the wafer disc. The wafer locating member installation/uninstallation mechanism takes off the wafer locating member, which is pressed against the circumference of the processed wafer on the wafer disc. Then the second robotic arm drives the wafer taking/placing mechanism to move the processed wafer on the wafer disc to the upper side of the wafer correction mechanism. After the wafer correction mechanism obtains the code of the processed wafer, the wafer taking/placing mechanism moves the processed wafer into the material rest mechanism. Accordingly, the wafers to be processed can be automatically, truly and quickly moved onto the wafer carrier disc and the respective processed wafers on the carrier disc can be automatically and quickly moved into the material rest mechanism.

To achieve the above and other objects, the wafer carrier disc installation/uninstallation device of the present invention includes: a first robotic arm connected with and drivable by a control module, at least an image capturing assembly being disposed at a movable end of the first robotic arm; a second robotic arm connected with and drivable by the control module, a wafer taking/placing mechanism being disposed at a movable end of the second robotic arm; a carrier disc disposed within a moving range of the first and second robotic arms, the carrier disc being connected with and drivable by the control module, at least one wafer disc being disposed on the carrier disc for placing a wafer on the wafer disc; a main correction mechanism positioned within the moving range of the first and second robotic arms, the main correction mechanism being connected with and drivable by the control module to respectively correct the operation positions of the image capturing assembly and the wafer taking/placing mechanism; a wafer correction mechanism positioned within the moving range of the second robotic arm, the wafer correction mechanism being connected with and drivable by the control module to read a code of the wafer placed therein and adjust a notch of the wafer; a material rest mechanism disposed within the moving range of the second robotic arm, the material rest mechanism having an internal space for receiving wafers; and a lockable wafer locating member is secured on the wafer disc to secure the wafer on the wafer disc.

In the above wafer carrier disc installation/uninstallation device, a wafer locating member installation/uninstallation mechanism is further disposed at the movable end of the first robotic arm to install/uninstall the wafer locating member.

In the above wafer carrier disc installation/uninstallation device, the image capturing assembly has an upper image capturing component capable of generating illuminating light beam and the main correction mechanism has a lower image capturing component. A transparent sheet is above the lower image capturing component. A standard scale is disposed on the transparent sheet as a locating reference. The wafer locating member installation/uninstallation mechanism has a locating face. A locating scale is disposed on the locating face. The wafer taking/placing mechanism has a wafer sucker for sucking the wafer. An indication scale is disposed on the wafer sucker.

In the above wafer carrier disc installation/uninstallation device, multiple laser sources are disposed beside the locating face of the wafer locating member installation/uninstallation mechanism.

In the above wafer carrier disc installation/uninstallation device, a range-finding laser source is disposed beside the lower image capturing component of the main correction mechanism.

In the above wafer carrier disc installation/uninstallation device, the material rest mechanism is a material receiving cartridge having an internal space for receiving the wafers. The material receiving cartridge is disposed on a lifting mechanism. The lifting mechanism is connected with and drivable by the control module to adjust the height of the material receiving cartridge.

In the above wafer carrier disc installation/uninstallation device, the carrier disc is disposed on a slide mechanism. The slide mechanism has a slide seat, which can move along multiple slide guide rails extending in parallel to each other. A pivotally rotational seat is disposed on the slide seat for supporting the carrier disc.

In the above wafer carrier disc installation/uninstallation device, an outer cover is secured on upper side of the slide guide rails. The outer cover is formed with a breach, whereby some of the wafer discs on the carrier disc are exposed to outer side through the breach.

In the above wafer carrier disc installation/uninstallation device, the wafer correction mechanism has a rest seat for placing the wafer thereon. A center of the rest seat is formed with a through hole. An image capturing unit is disposed above the rest seat. A sucker with vacuum sucking orifices is disposed under the through hole of the rest seat. The sucker is drivable by a rotational drive mechanism to ascend/descend and pivotally rotate.

To achieve the above and other objects, the installation/uninstallation method employing the above wafer carrier disc installation/uninstallation device includes steps of: correcting image capturing range of the image capturing assembly, the first robotic arm driving the image capturing assembly to move to the upper side of the main correction mechanism so as to correct the image capturing range of the image capturing assembly to a true position; correcting operation position of the wafer locating member installation/uninstallation mechanism, the first robotic arm driving the wafer locating member installation/uninstallation mechanism to move the locating face thereof to the upper side of the main correction mechanism so as to adjust and correct the operation position of the wafer locating member installation/uninstallation mechanism, the control module comparing the operation position of the wafer locating member installation/uninstallation mechanism with the image capturing range of the image capturing assembly and storing a relative position coordinate therebetween; making the image capturing assembly truly correspond to the wafer disc, the first robotic arm driving the image capturing assembly to move to the upper side of the carrier disc and correct the position to precisely correspond to one of the wafer discs on the carrier disc so as to check the condition on the wafer disc; making the wafer locating member installation/uninstallation mechanism take off the wafer locating member from the wafer disc, with reference to the relative position coordinate, the control module driving the first robotic arm to drive the wafer locating member installation/uninstallation mechanism so as to make the locating face aligned with the wafer disc and take out the wafer locating member previously disposed on the circumference of the wafer disc; correcting the operation position of the wafer taking/placing mechanism, the second robotic arm driving the wafer taking/placing mechanism to move to the upper side of the main correction mechanism so as to correct the operation position of the wafer taking/placing mechanism; making the wafer taking/placing mechanism place the wafer to be processed onto the wafer correction mechanism, the second robotic arm driving the wafer taking/placing mechanism to move into the material rest mechanism to take out the wafer to be processed and place the wafer to be processed into the wafer correction mechanism; making the wafer taking/placing mechanism read the code of the wafer to be processed and rotate the notch of the wafer to be processed to a true angle, the wafer correction mechanism obtaining the code and the notch position of the wafer to be processed and the wafer to be processed being rotated so as to adjust the notch of the wafer to be processed to a true angle; making the wafer taking/placing mechanism move the wafer to be processed onto the wafer disc, the second robotic arm driving the wafer taking/placing mechanism to take out the wafer to be processed from the wafer correction mechanism and place the wafer onto the wafer disc of the carrier disc; making the image capturing assembly obtain the image of the wafer to be processed, the first robotic arm driving the image capturing assembly to move to the upper side of the carrier disc and obtain the image of the wafer to be processed, which is previously placed on the wafer disc so as to ensure that the wafer to be processed is complete; making the wafer locating member installation/uninstallation mechanism install the wafer locating member on the wafer disc to secure the wafer to be processed, the first robotic arm driving the wafer locating member installation/uninstallation mechanism to connect the wafer locating member on the wafer disc, the wafer locating member pressing the circumference of the wafer to be processed so as to locate the same, then the control module driving the carrier disc to move to a predetermined external position to be processed; making the image capturing assembly truly correspond to the wafer disc, after the carrier disc, on which the processed wafers are placed, is moved from the outer side back to the lower side of the outer cover, the first robotic arm driving the image capturing assembly to move to the upper side of the carrier disc and correct the position to precisely correspond to one of the wafer discs on the carrier disc so as to check the condition on the wafer disc; making the wafer locating member installation/uninstallation mechanism take off the wafer locating member from the wafer disc, with reference to the relative position coordinate, the control module driving the first robotic arm to drive the wafer locating member installation/uninstallation mechanism so as to make the locating face aligned with the wafer disc and take out the wafer locating member secured on the circumference of the processed wafer on the circumference of the wafer disc; making the wafer taking/placing mechanism take off the processed wafer from the wafer disc and making the wafer correction mechanism read the code of the processed wafer, the second robotic arm driving the wafer taking/placing mechanism to move to the upper side of the wafer disc on the carrier disc to take out the processed wafer and place the processed wafer into the wafer correction mechanism to read the code of the processed wafer; and making the wafer taking/placing mechanism place the wafer into the material rest mechanism, the wafer taking/placing mechanism placing the processed wafer into the material rest mechanism.

In the above installation/uninstallation method, a lower image capturing component is disposed in the main correction mechanism. A transparent sheet is disposed above the lower image capturing component. A standard scale is disposed on the transparent sheet as a locating reference. An upper image capturing component is disposed in the image capturing assembly. In case the position of the standard scale within the image capturing range of the upper image capturing component is deflected from the position of the standard scale within the image capturing range of the lower image capturing component, the control module via the first robotic arm drives the image capturing assembly to adjust the position so as to overlap the position of the standard scale within the image capturing range of the upper image capturing component with the position of the standard scale within the image capturing range of the lower image capturing component, whereby the image capturing range of the image capturing assembly can be corrected to a true position.

In the above installation/uninstallation method, a lower image capturing component is disposed in the main correction mechanism. A transparent sheet is disposed above the lower image capturing component. A standard scale is disposed on the transparent sheet as a locating reference. An indication scale is disposed on the wafer taking/placing mechanism. In case the position of the standard scale within the image capturing range of the lower image capturing component is deflected from the position of the indication scale on the wafer taking/placing mechanism, the control module via the second robotic arm drives the wafer taking/placing mechanism to adjust the position so as to overlap the indication scale with the standard scale, whereby the operation position of the wafer taking/placing mechanism can be corrected to a true position.

In the above installation/uninstallation method, a lower image capturing component is disposed in the main correction mechanism. A transparent sheet is disposed above the lower image capturing component. A standard scale is disposed on the transparent sheet as a locating reference. A locating scale is disposed on the locating face of the wafer locating member installation/uninstallation mechanism. In case the position of the standard scale within the image capturing range of the lower image capturing component is deflected from the position of the locating scale on the locating face, the control module via the first robotic arm drives the wafer locating member installation/uninstallation mechanism to adjust the position so as to overlap the locating scale with the standard scale, whereby the operation position of the wafer locating member installation/uninstallation mechanism can be corrected to a true position.

In the above installation/uninstallation method, a lower image capturing component is disposed in the main correction mechanism and a range-finding laser source is disposed beside the lower image capturing component. The range-finding laser source serves to generate laser beams to respectively measure the distance between the image capturing assembly and the lower image capturing component, the distance between the wafer locating member installation/uninstallation mechanism and the lower image capturing component and the distance between the wafer taking/placing mechanism and the lower image capturing component, whereby the control module can adjust the focal length of the lens of the lower image capturing component.

In the above installation/uninstallation method, at least three laser sources are disposed around the wafer locating member installation/uninstallation mechanism. In the step of making the wafer locating member installation/uninstallation mechanism take off the wafer locating member from the wafer disc, the control module drives the first robotic arm to drive the wafer locating member installation/uninstallation mechanism to adjust the position, whereby the laser sources generate and project laser beams with the same length onto the wafer disc so as to make the wafer locating member installation/uninstallation mechanism truly correspond to the wafer disc.

In the above installation/uninstallation method, the wafer correction mechanism at least has a rest seat for placing the wafer thereon, an image capturing unit for obtaining the code and notch position of the wafer and a rotational drive mechanism, the rotational drive mechanism serving to drive the wafer to rotate so as to adjust the notch of the wafer to a true angle.

The present invention can be best understood through the following description and accompanying drawings, wherein:

Figure 1:
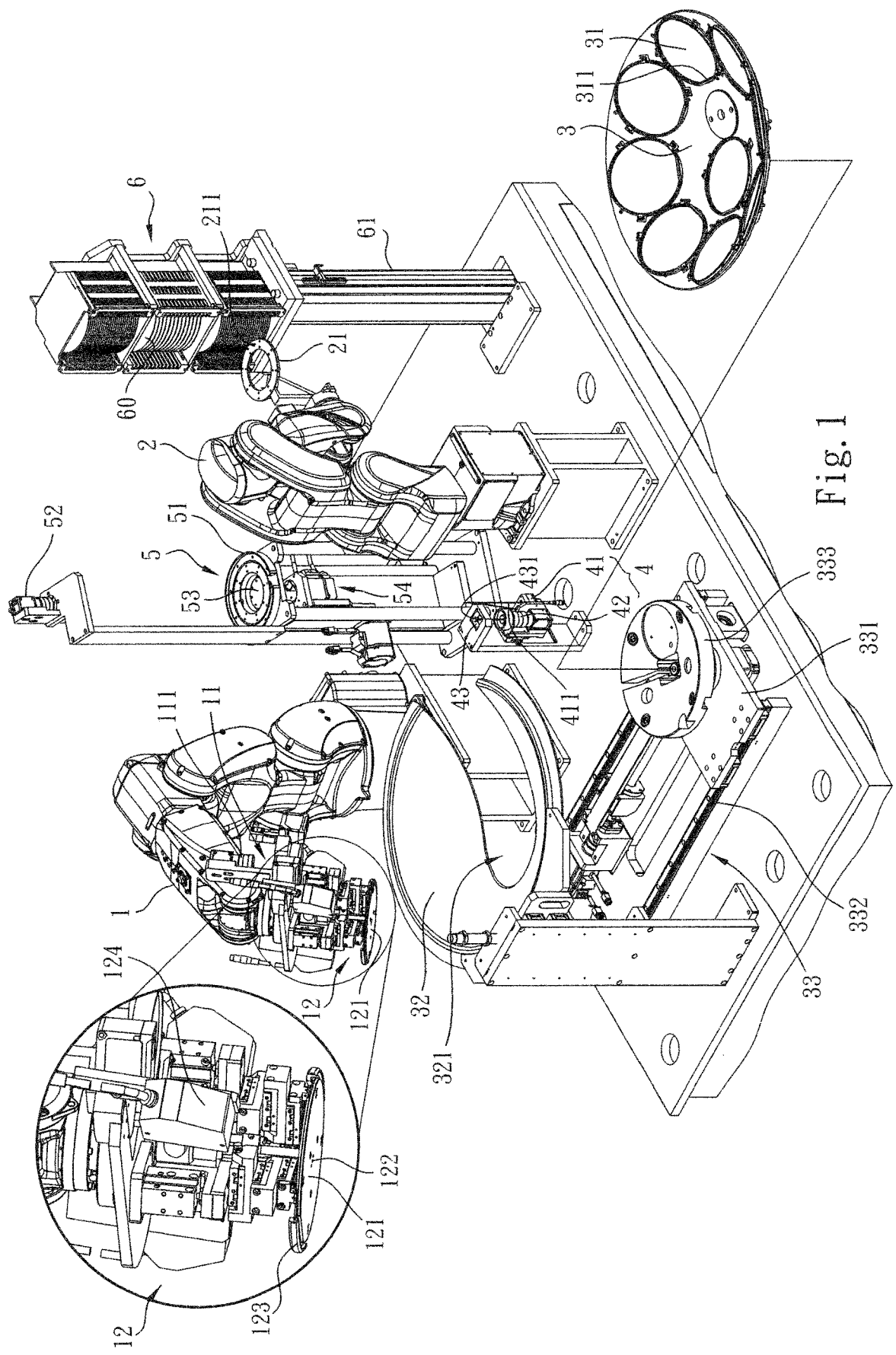
FIG. 1 is a perspective view of the present invention, in which the carrier disc is partially exploded.

REFERENCE NUMBERS OF THE DRAWINGS 1 first robotic arm
11 image capturing assembly
111 upper image capturing component
12 wafer locating member installation/uninstallation mechanism
121 locating face
122 locating scale
123 holding components
124 laser sources
2 second robotic arm
21 wafer taking/placing mechanism
211 indication scale
121 locating face
3 carrier disc
31 wafer disc
311 wafer locating member
32 outer cover
33 slide mechanism
331 slide seat
332 slide guide rail
333 pivotally rotational seat
4 main correction mechanism
41 range-finding laser source
411 laser beams
42 lower image capturing component
43 transparent sheet
431 standard scale
5 wafer correction mechanism
51 rest seat
52 image capturing unit
53 sucker 54 rotational drive mechanism
6 material rest mechanism
60 wafer to be processed
6a processed wafer
61 lifting mechanism
step S11 correcting image capturing range of the image capturing assembly,
step S12 correcting operation position of the wafer locating member installation/uninstallation mechanism,
step S13 making the image capturing assembly truly correspond to the wafer disc,
step S14 making the wafer locating member installation/uninstallation mechanism take off the wafer locating member from the wafer disc,
step S15 correcting the operation position of the wafer taking/placing mechanism,
step S16 making the wafer taking/placing mechanism place the wafer to be processed onto the wafer correction mechanism,
step S17 making the wafer taking/placing mechanism read the code of the wafer to be processed and rotate the notch of the wafer to be processed to a true angle,
step S18 making the wafer taking/placing mechanism move the wafer to be processed onto the wafer disc,
step S19 making the image capturing assembly obtain the image of the wafer to be processed,
step S20 making the wafer locating member installation/uninstallation mechanism install the wafer locating member on the wafer disc to secure the wafer to be processed,
step S21 outward moving the carrier disc,
step S22 moving the carrier disc back to home position,
step S23 making the image capturing assembly truly correspond to the wafer disc,
step S24 making the wafer locating member installation/uninstallation mechanism take off the wafer locating member from the wafer disc,
step S25 making the wafer taking/placing mechanism take off the processed wafer from the wafer disc and making the wafer correction mechanism read the code of the processed wafer
step S26 making the wafer taking/placing mechanism place the processed wafer into the material rest mechanism.

DETAILED DESCRIPTION OF THE PREFERRED EMBODIMENTS

Figure 2:
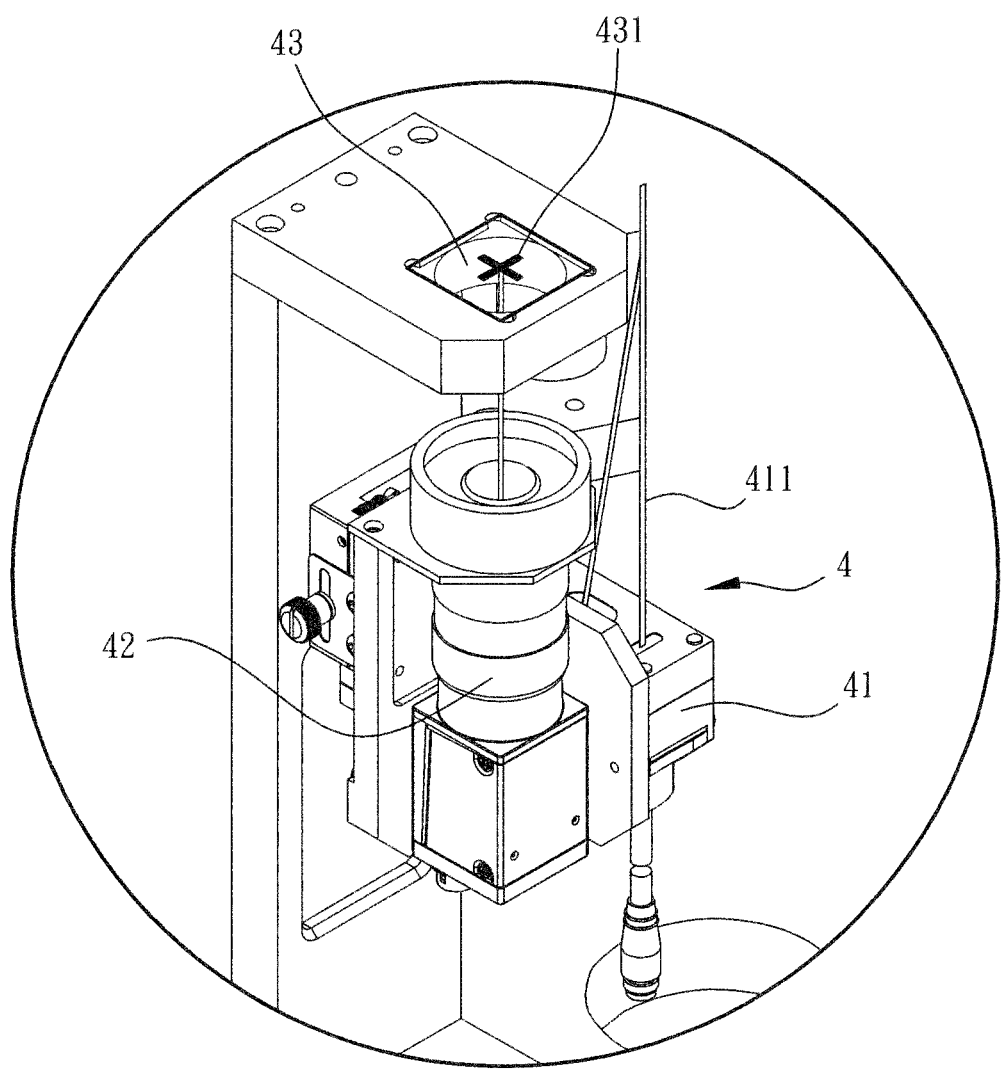
FIG. 2 is an enlarged view of the main correction mechanism of the present invention.

Please refer to FIGS. 1 and 2. The main structure of the present invention includes a first robotic arm 1, a second robotic arm 2, a carrier disc 3, a main correction mechanism 4, a wafer correction mechanism 5 and a material rest mechanism 6. The first robotic arm 1 is connected with and drivable by a control module, (which can be a computer with operation function, not shown). An image capturing assembly 11 and a wafer locating member installation/uninstallation mechanism 12 are disposed at a movable end of the first robotic arm 1.

In a preferred embodiment, the image capturing assembly 11 has an upper image capturing component 111 capable of generating illuminating light beam, (which can be a CCD camera). The wafer locating member installation/uninstallation mechanism 12 has a locating face 121. A locating scale 122, (which can be a perforation) is disposed at (the center of) the locating face 121. At least two oppositely movable holding components 123 are disposed on an outer circumference of the locating face 121. Multiple laser sources 124 are uniformly distributed along the circumference of the wafer locating member installation/uninstallation mechanism 12. The multiple laser sources 124 are respectively disposed at at least three points beside the locating face 121.

The second robotic arm 2 is connected with and drivable by the control module. A wafer taking/placing mechanism 21, (which can be a wafer sucker), is disposed at a movable end of the second robotic arm 2 for sucking a wafer 60 to be processed or a processed wafer 6a. In a preferred embodiment, an indication scale 211 is disposed on the wafer taking/placing mechanism 21 (wafer sucker).

The carrier disc 3 is a spherical disc body disposed within the moving range of the first and second robotic arms 1 and 2. The carrier disc 3 is connected with and drivable by the control module. Multiple wafer discs 31 are disposed on the carrier disc 3 in different positions. A lockable wafer locating member 311, (which can be a press ring), is disposed on each wafer disc 31.

In a preferred embodiment, the carrier disc 3 is disposed on a slide mechanism 33. An outer cover 32 is secured on upper side of the carrier disc 3. The outer cover 32 is formed with a breach 321, whereby some of the wafer discs 31 on the carrier disc 3 are exposed to outer side through the breach 321. The slide mechanism 33 has a slide seat 331. The slide seat 331 is disposed on multiple slide guide rails 332 extending in parallel to each other. A pivotally rotational seat 333 is disposed on the slide seat 331 for supporting the carrier disc 3. The control module serves to operate the slide mechanism 33 to make the slide seat 331 drive the pivotally rotational seat 333 to slide between two ends of the slide guide rails 332. In addition, the pivotally rotational seat 333 can drive the carrier disc 3 to pivotally rotate.

The main correction mechanism 4 is positioned within a common moving range of the first and second robotic arms 1, 2. The main correction mechanism 4 is connected with and drivable by the control module to respectively correct the image capturing assembly 11, the wafer locating member installation/uninstallation mechanism 12 and the wafer taking/placing mechanism 21 and make the image capturing assembly 11, the wafer locating member installation/uninstallation mechanism 12 and the wafer taking/placing mechanism 21 respectively keep in true operation positions.

In a preferred embodiment, the main correction mechanism 4 has a lower image capturing component 42 capable of generating illuminating light beam and at least one range-finding laser source 41 with range-finding function. The lower image capturing component 42 can be a CCD camera. A transparent sheet 43 is disposed above the lower image capturing component 42. A standard scale 431 is disposed at the center of the transparent sheet 43.

The wafer correction mechanism 5 is positioned within the moving range of the second robotic arm 2 and is connected with and drivable by the control module. In this embodiment, the wafer correction mechanism 5 has a rest seat 51 for placing the wafer 60 to be processed or the processed wafer 6a thereon. A center of the rest seat 51 is formed with a through hole. An image capturing unit 52 is disposed above the rest seat 51. A sucker 53 with vacuum sucking orifices is disposed under the through hole for sucking the wafer 60 to be processed or the processed wafer 6a. The sucker 53 is drivable by a rotational drive mechanism 54 to perform the ascending/descending and pivotally rotational operations.

The material rest mechanism 6, (which can be a material receiving cartridge), is disposed within the moving range of the second robotic arm 2. The material rest mechanism 6 has an internal space for receiving multiple sheet-shaped wafer 60 to be processed or processed wafer 6a.

In practice, a lifting mechanism 61 is disposed under the material rest mechanism 6 as necessary. The lifting mechanism 61 serves to drive the material rest mechanism 6 (the material receiving cartridge) to ascend/descend.

Figure 3:
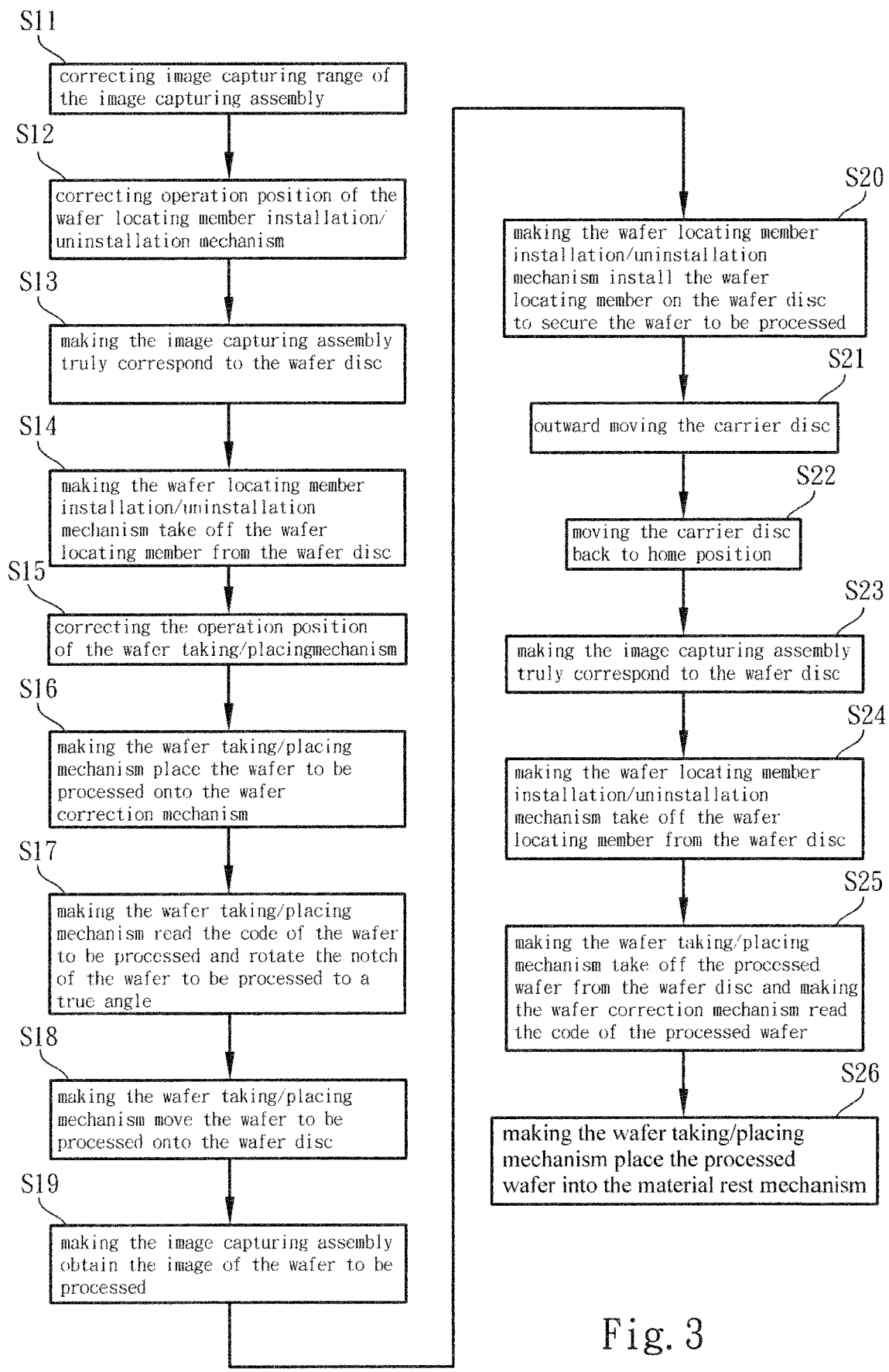
FIG. 3 is a flow chart of the installation/uninstallation method of the present invention.

Please refer to FIG. 3. The installation/uninstallation method of the present invention includes step S11 of correcting image capturing range of the image capturing assembly, step S12 of correcting operation position of the wafer locating member installation/uninstallation mechanism, step S13 of making the image capturing assembly truly correspond to the wafer disc, step S14 of making the wafer locating member installation/uninstallation mechanism take off the wafer locating member from the wafer disc, step S15 of correcting the operation position of the wafer taking/placing mechanism, step S16 of making the wafer taking/placing mechanism place the wafer to be processed onto the wafer correction mechanism, step S17 of making the wafer taking/placing mechanism read the code of the wafer to be processed and rotate the notch of the wafer to be processed to a true angle, step S18 of making the wafer taking/placing mechanism move the wafer to be processed onto the wafer disc, step S19 of making the image capturing assembly obtain the image of the wafer to be processed, step S20 of making the wafer locating member installation/uninstallation mechanism install the wafer locating member on the wafer disc to secure the wafer to be processed, step S21 of outward moving the carrier disc, step S22 of moving the carrier disc back to home position, step S23 of making the image capturing assembly truly correspond to the wafer disc, step S24 of making the wafer locating member installation/uninstallation mechanism take off the wafer locating member from the wafer disc, step S25 of making the wafer taking/placing mechanism take off the processed wafer from the wafer disc and making the wafer correction mechanism read the code of the processed wafer and step S26 of making the wafer taking/placing mechanism place the processed wafer into the material rest mechanism. The above steps will be respectively described hereinafter with reference to FIGS. 4 to 26 as well as the structure shown in FIGS. 1 and 2.

Figure 4:
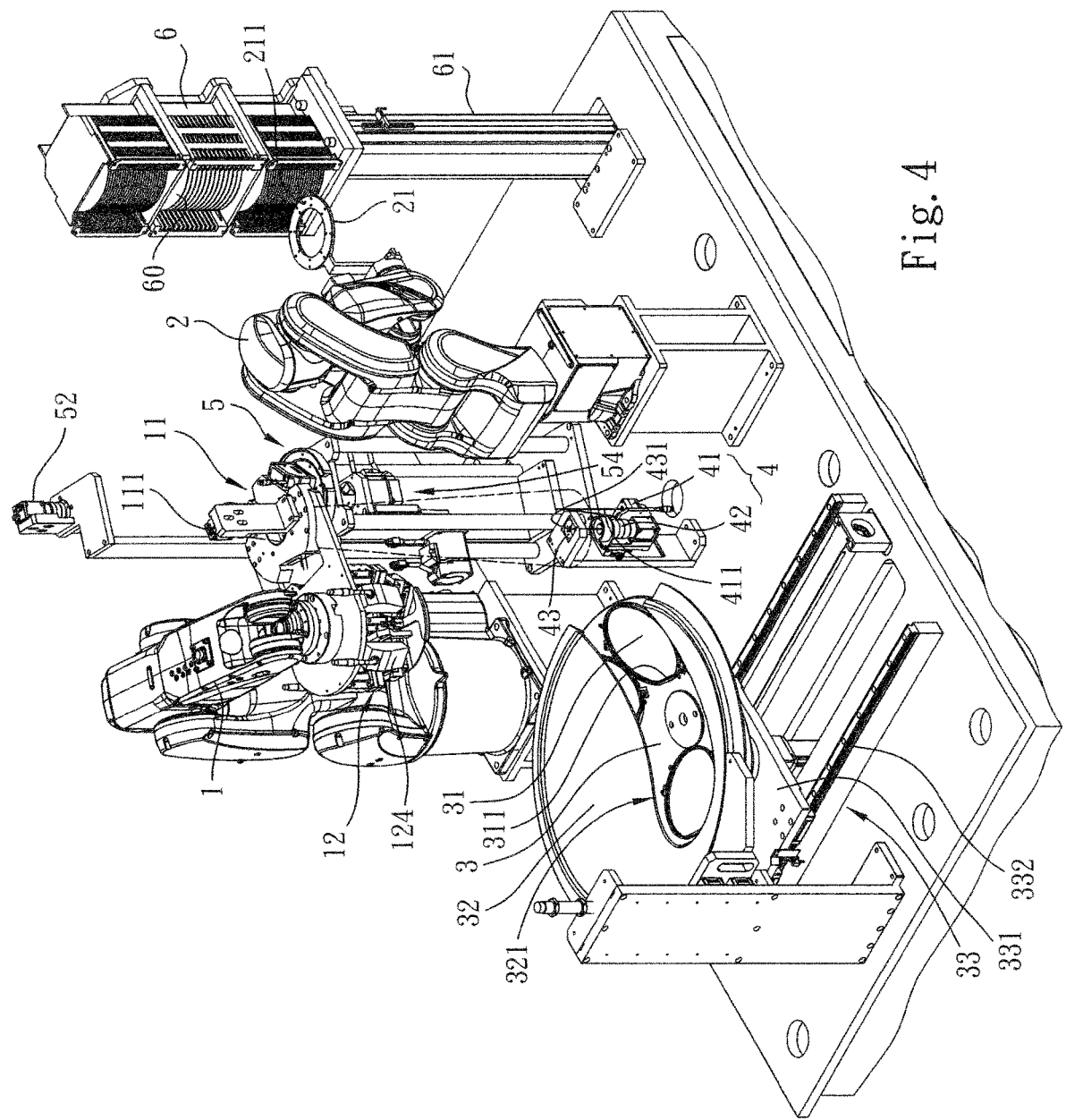
FIG. 4 is a perspective view of the present invention, showing that the image capturing assembly is moved to the upper side of the main correction mechanism to correct the position.

First, in step S11 of correcting image capturing range of the image capturing assembly, the first robotic arm 1 drives the image capturing assembly 11 to move to the upper side of the main correction mechanism 4 (as shown in FIG. 4) so as to adjust and correct the image capturing range of the image capturing assembly 11 to a true position.

In this embodiment, when the first robotic arm 1 drives the image capturing assembly 11 to approach the upper side of the main correction mechanism 4, the lower image capturing component 42 directly obtains the position of the standard scale 431 on the transparent sheet 43. In addition, the range-finding laser source 41 of the main correction mechanism 4 generates and projects laser beams 411 onto the image capturing assembly 11 to measure the distance between the main correction mechanism 4 and the image capturing assembly 11 so as to adjust the focal length of the lens of the lower image capturing component 42. The upper image capturing component 111 of the image capturing assembly 11 obtains the position of the standard scale 431 on the transparent sheet 43. The control module compares the position of the standard scale 431 obtained by the lower image capturing component 42 and the position of the standard scale 431 obtained by the image capturing assembly 11 and finds the difference therebetween. The first robotic arm 1 adjusts the position of the image capturing assembly 11 and makes the image of the standard scale 431 obtained by the upper image capturing component 111 overlap with the position of the standard scale 431 obtained by the lower image capturing component 42. Then the control modules stores the coordinate of the true image capturing range of the image capturing assembly 11 so as to achieve the object of correcting the image capturing range of the image capturing assembly 11.

Figure 5:
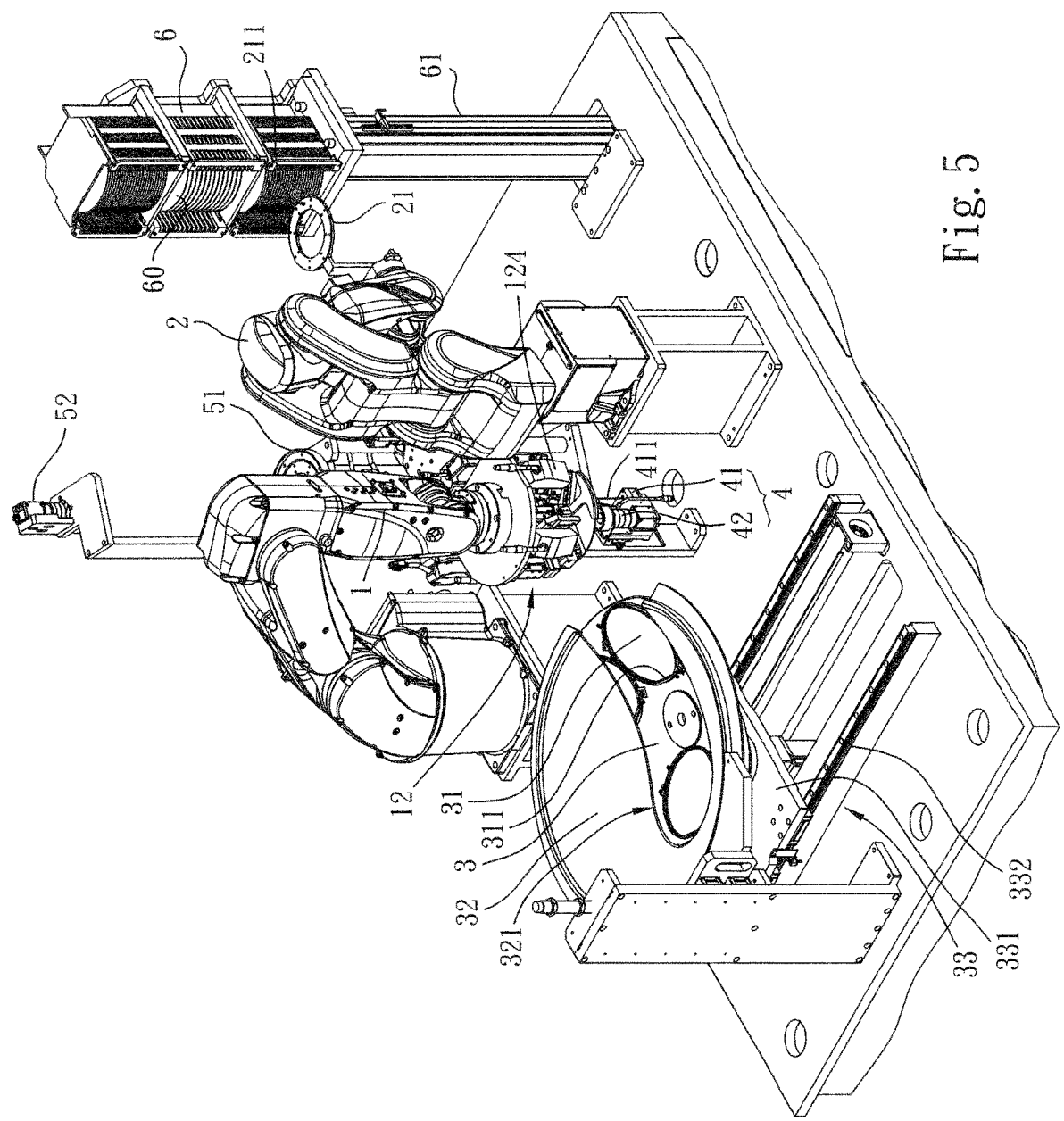
FIG. 5 is a perspective view of the present invention, showing that the wafer locating member installation/uninstallation mechanism is moved to the upper side of the main correction mechanism to correct the position.

In step S12 of correcting operation position of the wafer locating member installation/uninstallation mechanism, the first robotic arm 1 drives the wafer locating member installation/uninstallation mechanism 12 to move the locating face 121 thereof to the upper side of the main correction mechanism 4 (as shown in FIG. 5) so as to adjust and correct the operation position of the wafer locating member installation/uninstallation mechanism 12. In addition, the control module compares the operation position of the wafer locating member installation/uninstallation mechanism 12 with the image capturing range of the image capturing assembly 11 and stores the relative position coordinate therebetween.

In this embodiment, when the first robotic arm 1 drives the wafer locating member installation/uninstallation mechanism 12 to approach the upper side of the main correction mechanism 4, the range-finding laser source 41 of the main correction mechanism 4 generates and projects laser beams onto the locating face 121 so as to measure the distance between the main correction mechanism 4 and the wafer locating member installation/uninstallation mechanism 12 so as to adjust the focal length of the lens of the lower image capturing component 42. The lower image capturing component 42 observes the standard scale 431 on the transparent sheet 43 and through the transparent sheet 43 observes the position difference between the standard scale 431 and the locating scale 122 (or perforation) on the locating face 121. The control module drives the first robotic arm 1 to adjust the position of the wafer locating member installation/uninstallation mechanism 12 so as to make the locating scale 122 (or perforation) on the locating face 121 overlap with the position of the standard scale 431, whereby the operation position of the wafer locating member installation/uninstallation mechanism 12 can be adjusted to a true position.

Figure 6:
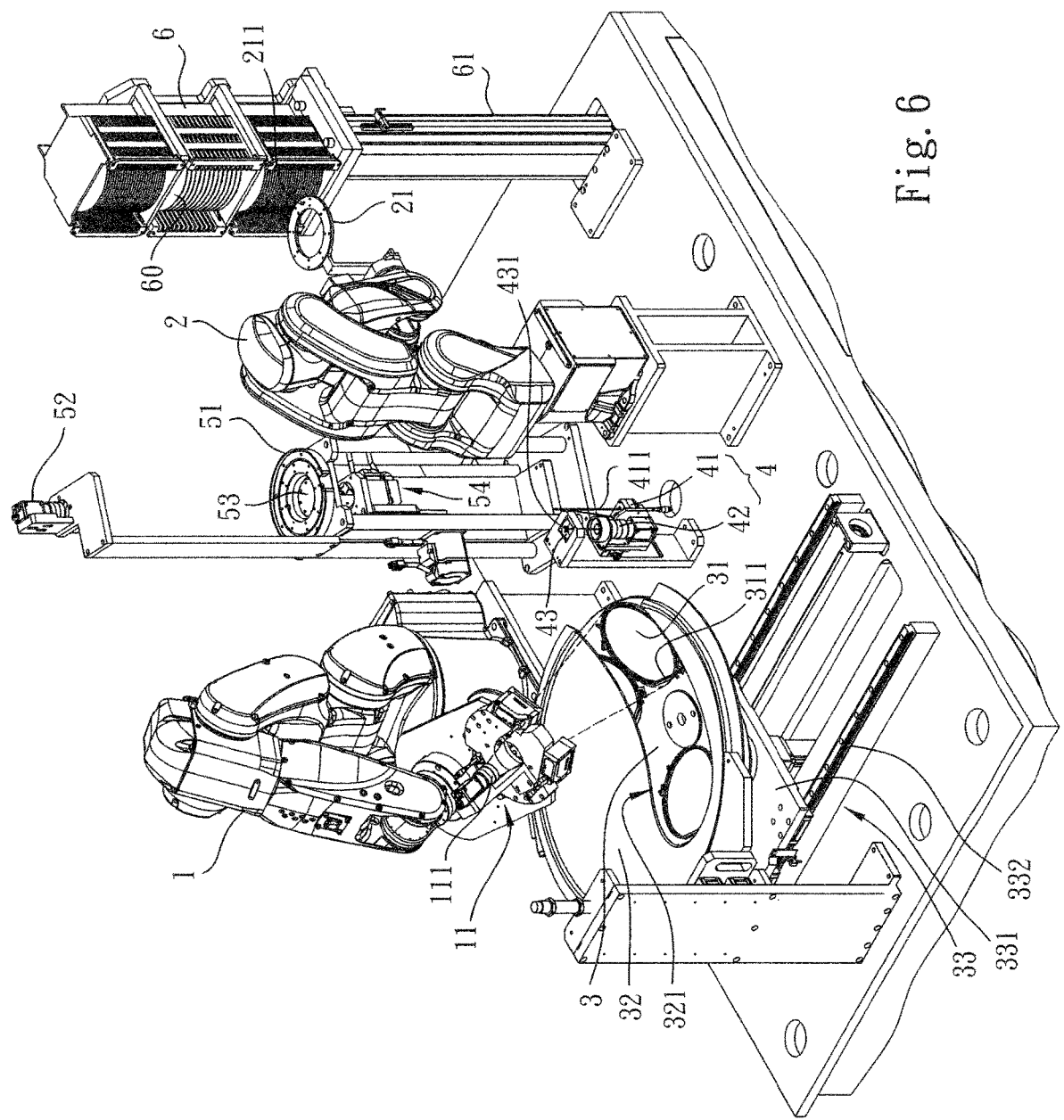
FIG. 6 is a perspective view of the present invention, showing that the image capturing assembly is moved to the upper side of the carrier disc to truly correspond to the wafer disc.

In step S13 of making the image capturing assembly truly correspond to the wafer disc, the first robotic arm 1 drives the image capturing assembly 11 to move to the upper side of the breach 321 of the outer cover 32 (as shown in FIG. 6) for obtaining the image of the wafer disc 31 corresponding to the breach 321 so as to check the condition on the wafer disc 31 (whether a chip or a fragment of the wafer 60 remains thereon).

Figure 7:
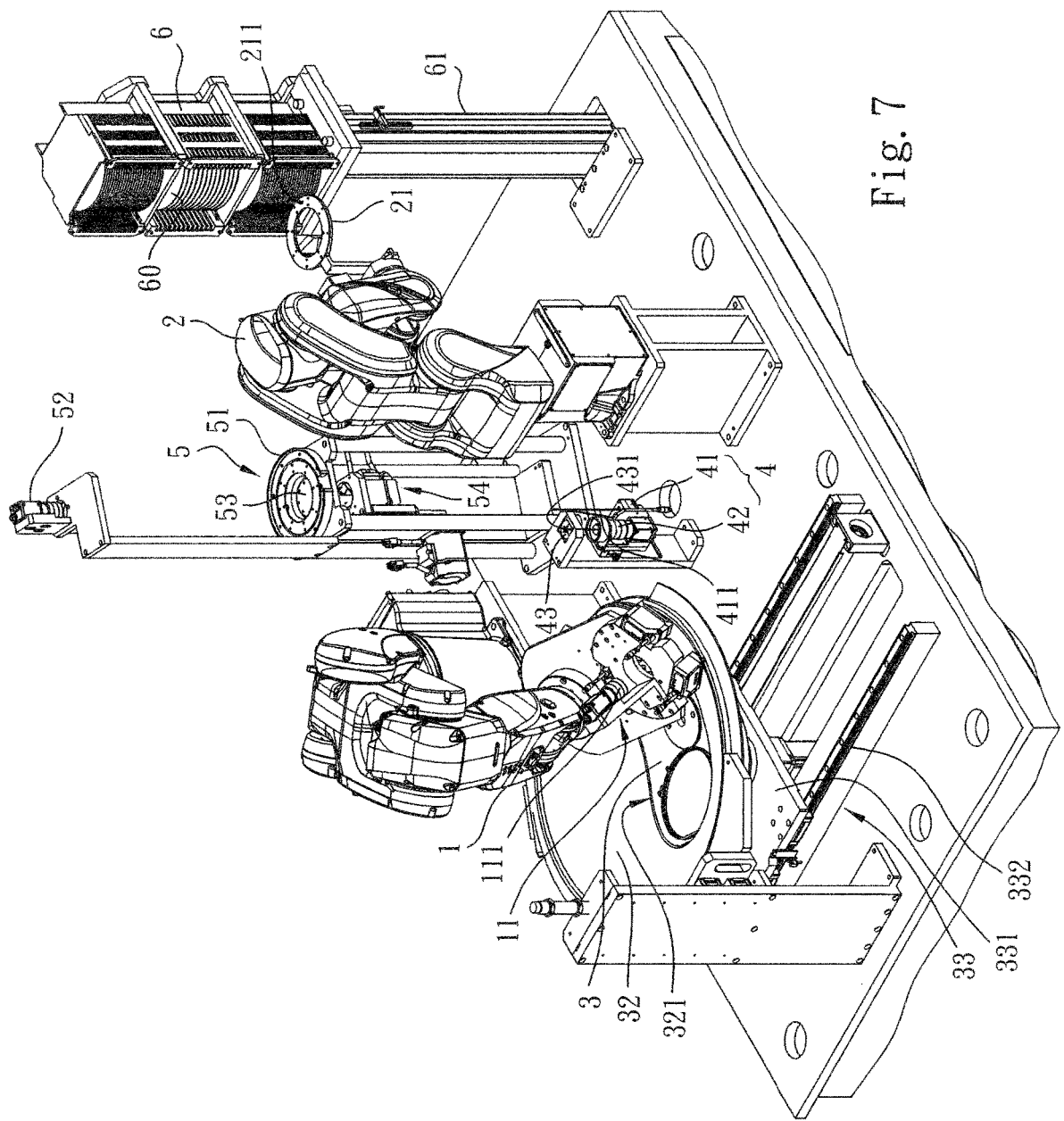
FIG. 7 is a perspective view of the present invention, showing that the wafer locating member installation/uninstallation mechanism is moved to the upper side of the wafer disc to take off the wafer locating member.
Figure 8:
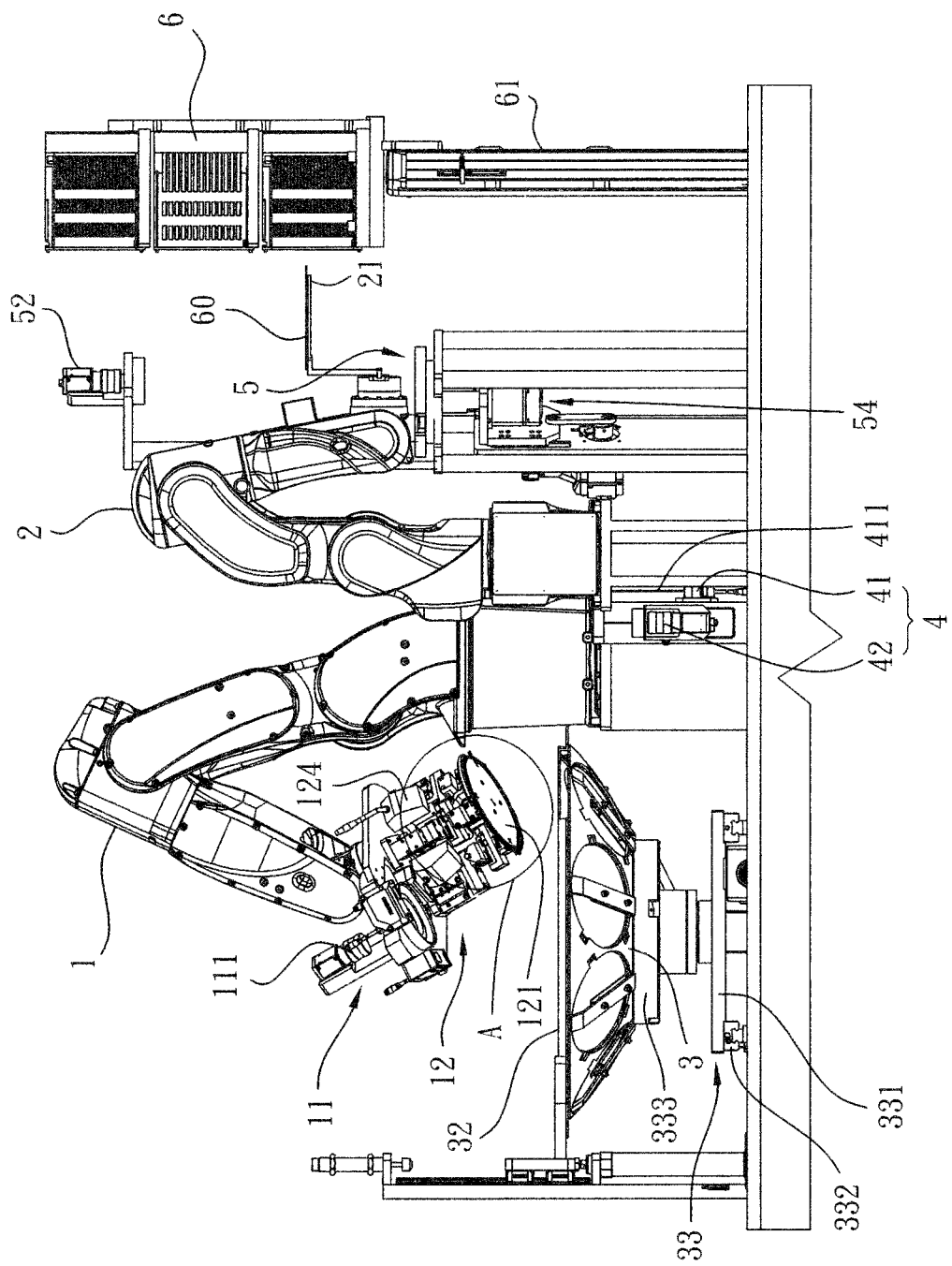
FIG. 8 is a perspective view of the present invention, showing that the wafer locating member installation/uninstallation mechanism takes off the wafer locating member.
Figure 9:
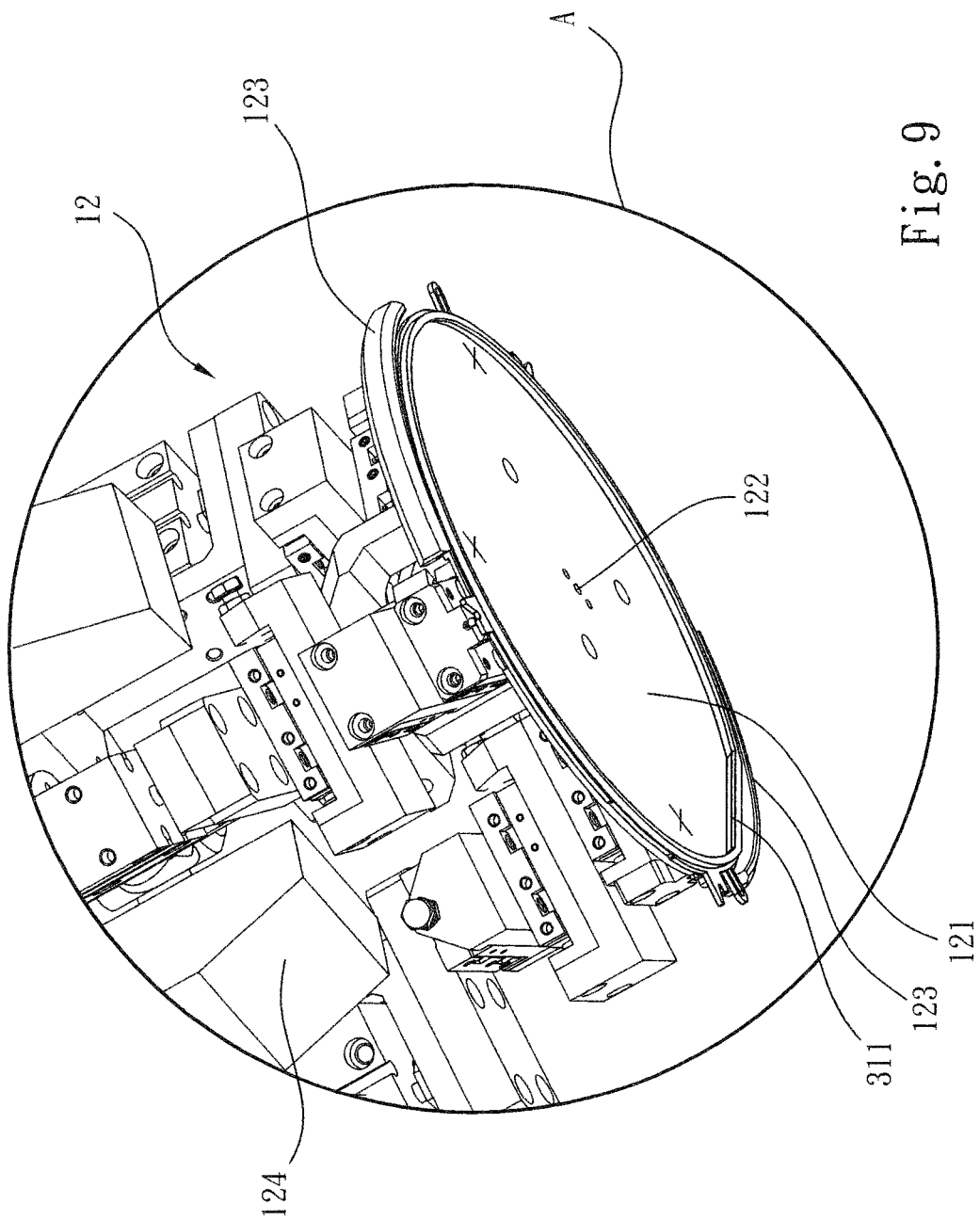
FIG. 9 is an enlarged view of circled area A of FIG. 8

In step S14 of making the wafer locating member installation/uninstallation mechanism take off the wafer locating member from the wafer disc, with reference to the relative position coordinate, the control module drives the first robotic arm 1 to drive the wafer locating member installation/uninstallation mechanism 12 to approach the wafer disc 31 corresponding to the breach 321 and then drive the wafer locating member installation/uninstallation mechanism 12 to adjust the position, whereby the laser source 124 generates and projects multiple (at least three) laser beams with the same length onto the wafer disc 31 so as to make the locating face 121 aligned with (in parallel to) the wafer disc 31 (as shown in FIG. 7). Then, after the wafer locating member 311 previously disposed on the circumference of the wafer disc 31 is unlocked by the wafer locating member installation/uninstallation mechanism 12, the holding components 123 are used to take out the wafer locating member 311 and keep in a holding state (as shown in FIGS. 8 and 9).

Figure 10:
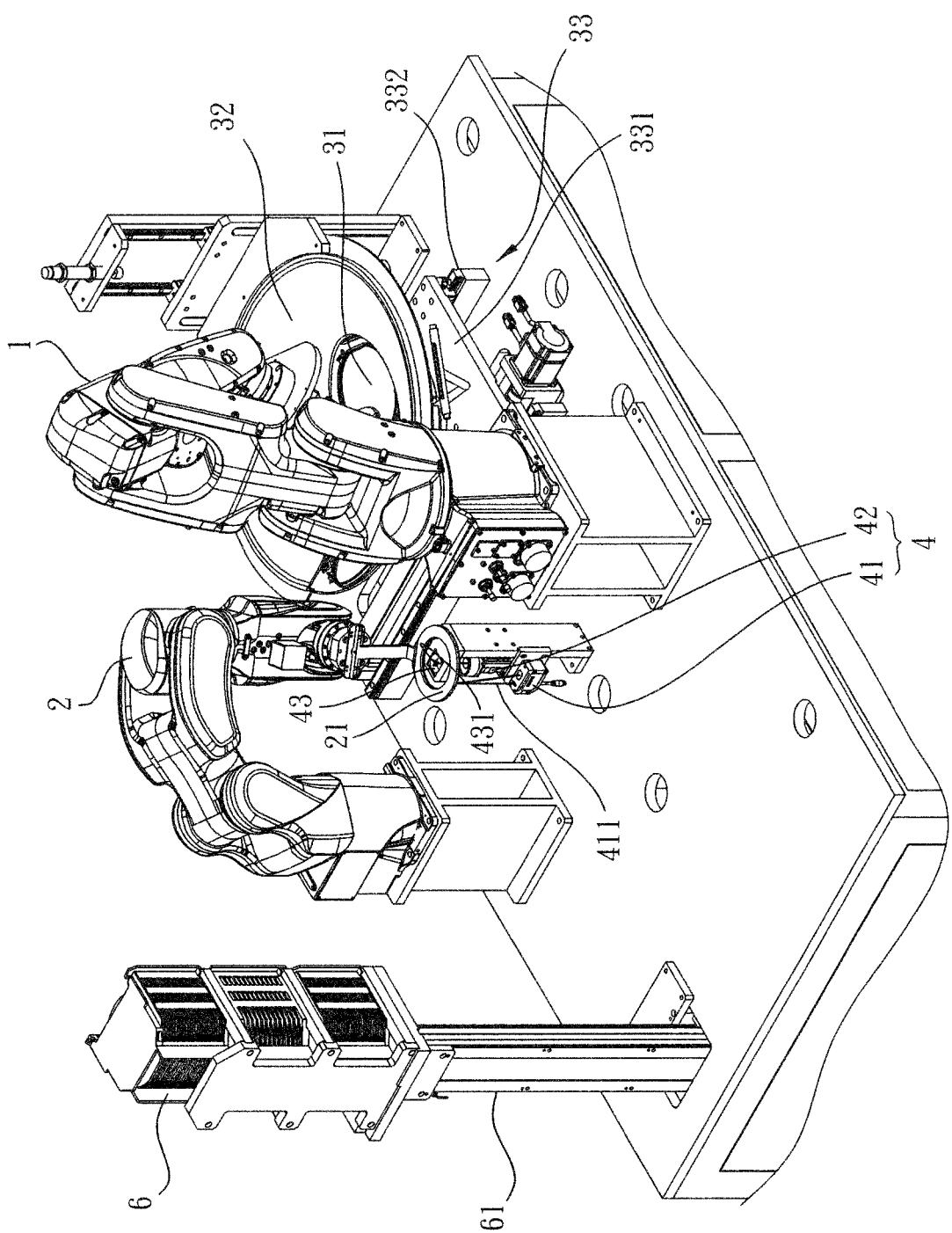
FIG. 10 is a perspective view of the present invention, showing that the wafer taking/placing mechanism is moved to the upper side of the main correction mechanism to correct the position.

In step S15 of correcting the operation position of the wafer taking/placing mechanism, the second robotic arm 2 drives the wafer taking/placing mechanism 21 to move to the upper side of the main correction mechanism 4 (as shown in FIG. 10, the wafer correction mechanism 5 is not shown for easily observing the main correction mechanism 4) so as to correct the operation position of the wafer taking/placing mechanism 21.

In this embodiment, when the second robotic arm 2 drives the wafer taking/placing mechanism 21 to approach the upper side of the main correction mechanism 4, the range-finding laser source 41 of the main correction mechanism 4 generates and projects laser beams onto the wafer taking/placing mechanism 21 so as to measure the distance between the main correction mechanism 4 and the wafer taking/placing mechanism 21 and adjust the focal length of the lens of the lower image capturing component 42. The lower image capturing component 42 observes the standard scale 431 on the transparent sheet 43. Also, the lower image capturing component 42 through the transparent sheet 43 observes the position of the indication scale 211 on the wafer taking/placing mechanism 21 and compares the position of the indication scale 211 and the position of the standard scale 431 to find the difference therebetween. The control module via the second robotic arm 2 drives the wafer taking/placing mechanism 21 to adjust the position so as to make the indication scale 211 on the wafer taking/placing mechanism 21 overlap with the standard scale 431 and correct the operation position of the wafer taking/placing mechanism 21 to a true position.

Figure 11:
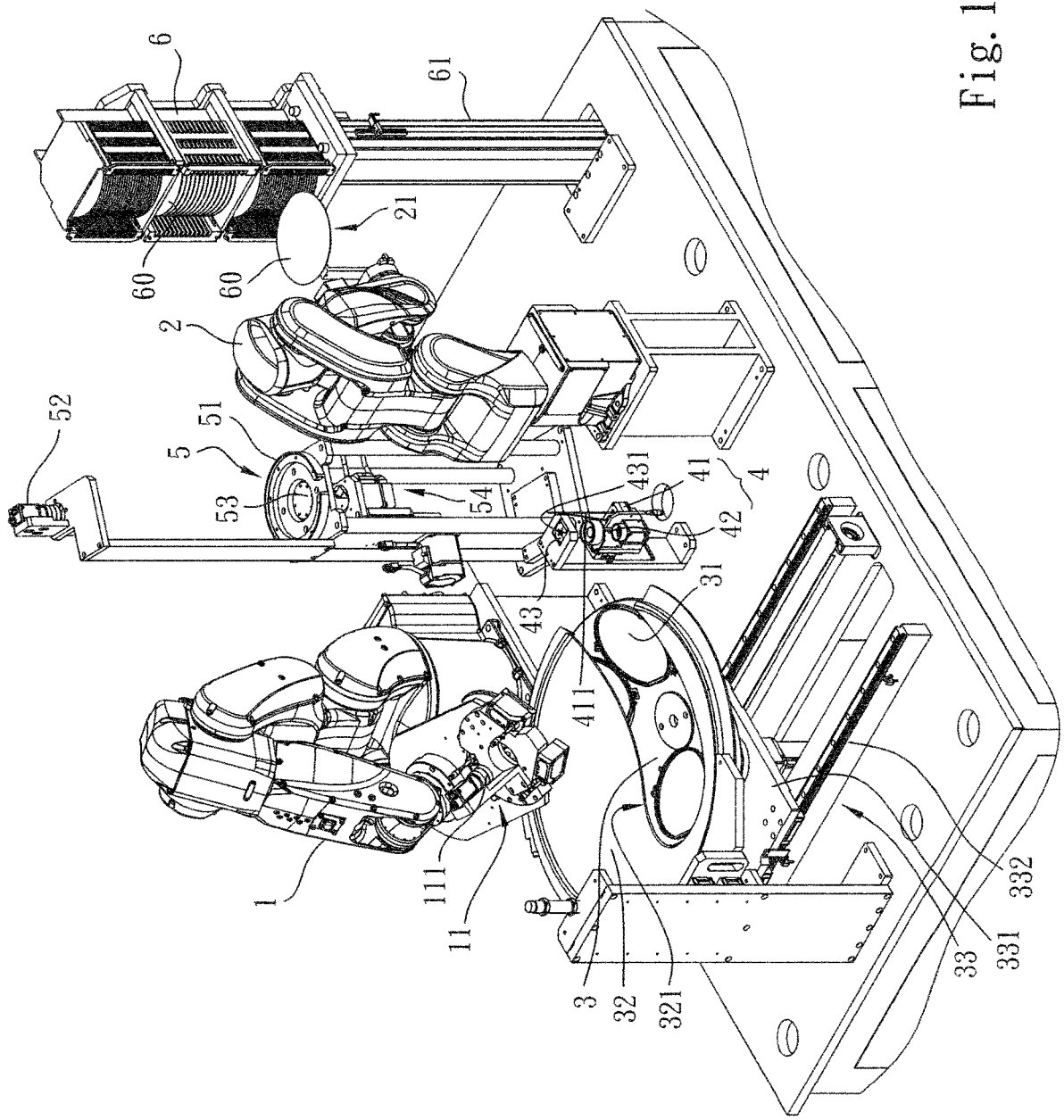
FIG. 11 is a perspective view of the present invention, showing that the wafer taking/placing mechanism takes out the wafer to be processed from the material rest mechanism.
Figure 12:
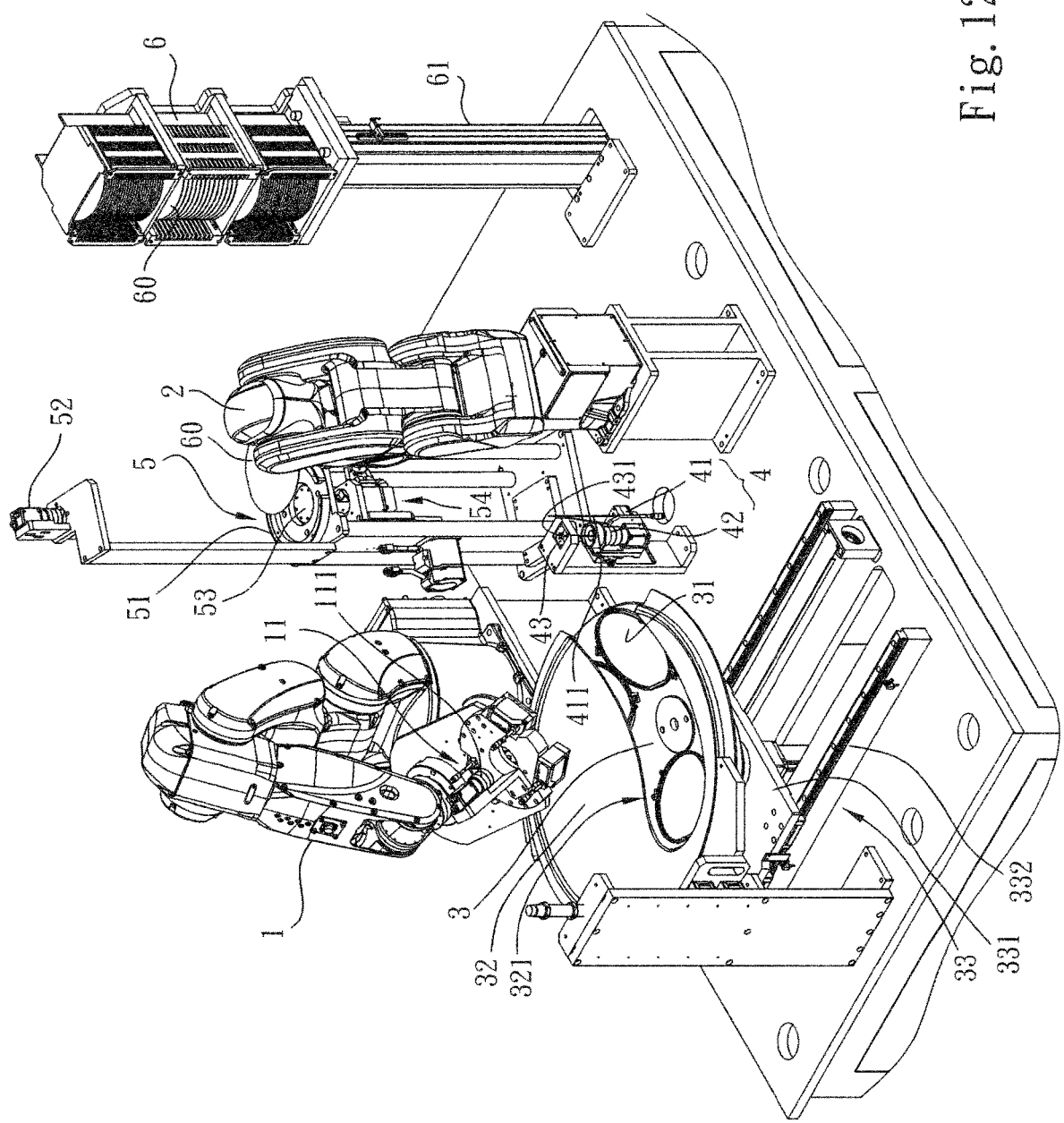
FIG. 12 is a perspective view of the present invention, showing that the wafer taking/placing mechanism places the wafer to be processed onto the wafer correction mechanism.

In step S16 of making the wafer taking/placing mechanism place the wafer to be processed onto the wafer correction mechanism, the second robotic arm 2 drives the wafer taking/placing mechanism 21 to move into the material rest mechanism 6 to take out the wafer 60 to be processed (as shown in FIG. 11) and place the wafer 60 to be processed onto the rest seat 51 of the wafer correction mechanism 5 (as shown in FIG. 12).

Figure 13:
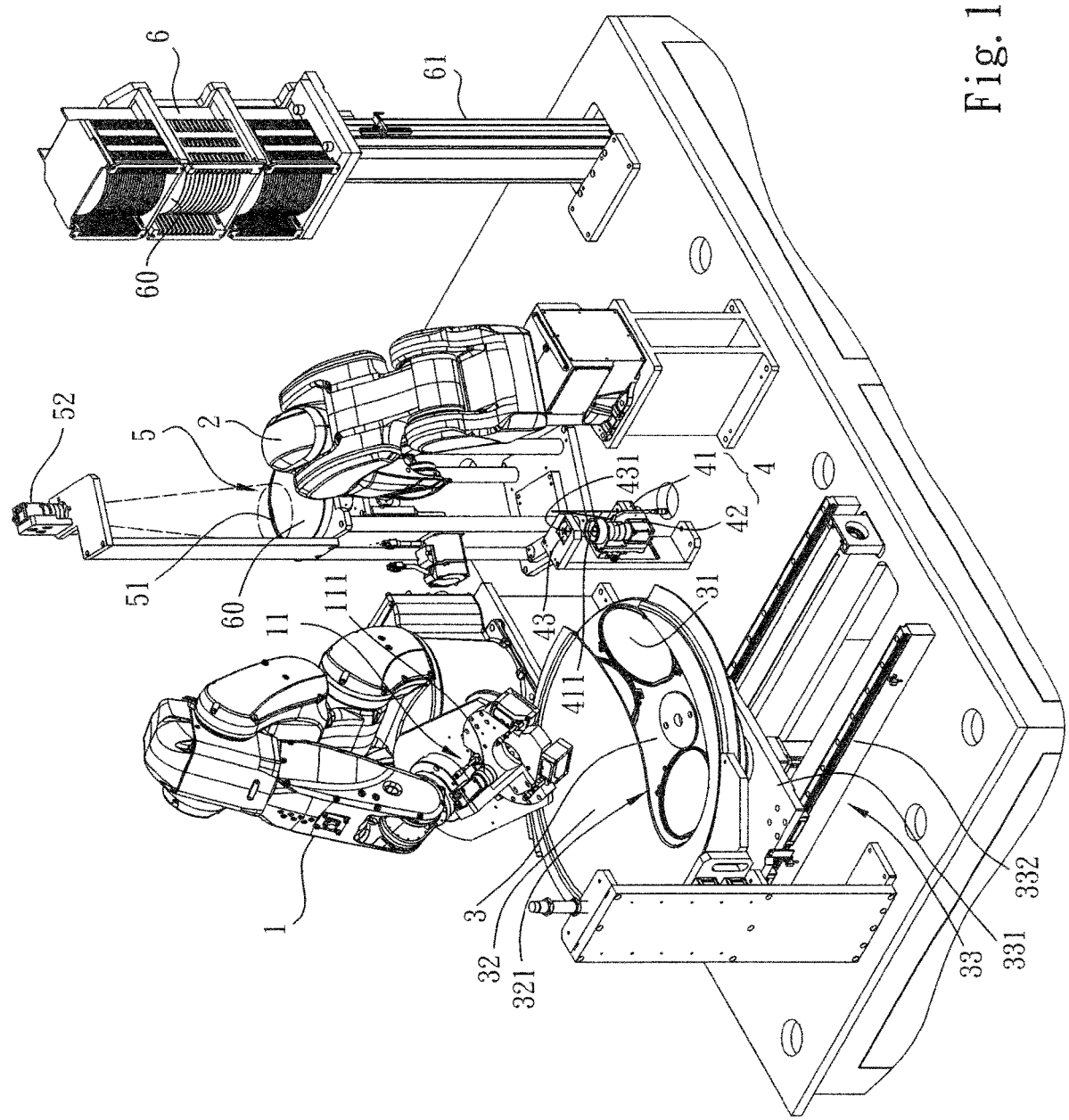
FIG. 13 is a perspective view of the present invention, showing that the wafer correction mechanism corrects the wafer to be processed.

In step S17 of making the wafer taking/placing mechanism read the code of the wafer to be processed and rotate the notch of the wafer to be processed to a true angle, the image capturing unit 52 of the wafer correction mechanism 5 first obtains the code and the notch position of the wafer 60 to be processed (as shown in FIG. 13). Then, according to the notch position of the wafer 60 to be placed into the wafer disc 31, the control module calculates the angle of the wafer 60 to be processed, which needs to be adjusted. Then the rotational drive mechanism 54 drives the sucker 53 to suck and lift the wafer 60 to be processed (separate from the rest seat 51). Then the wafer 60 to be processed is rotated so as to adjust the notch of the wafer 60 to be processed to a true angle. Then the rotational drive mechanism 54 drives the sucker 53 to suck and lower the wafer 60 to be processed so as to place the wafer 60 to be processed back onto the rest seat 51.

Figure 14:
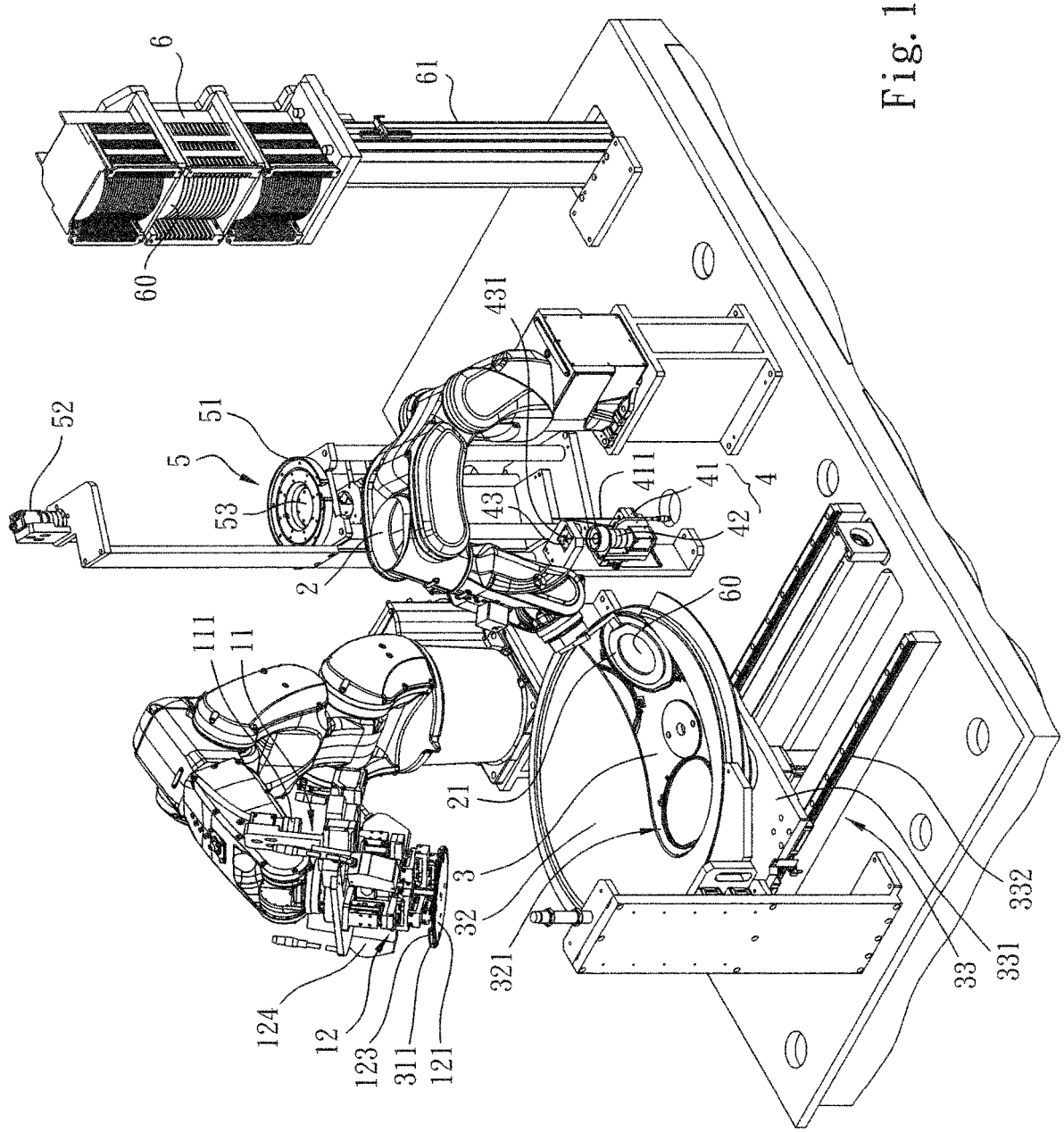
FIG. 14 is a perspective view of the present invention, showing that the wafer correction mechanism moves the wafer to be processed onto the wafer disc.
Figure 15:
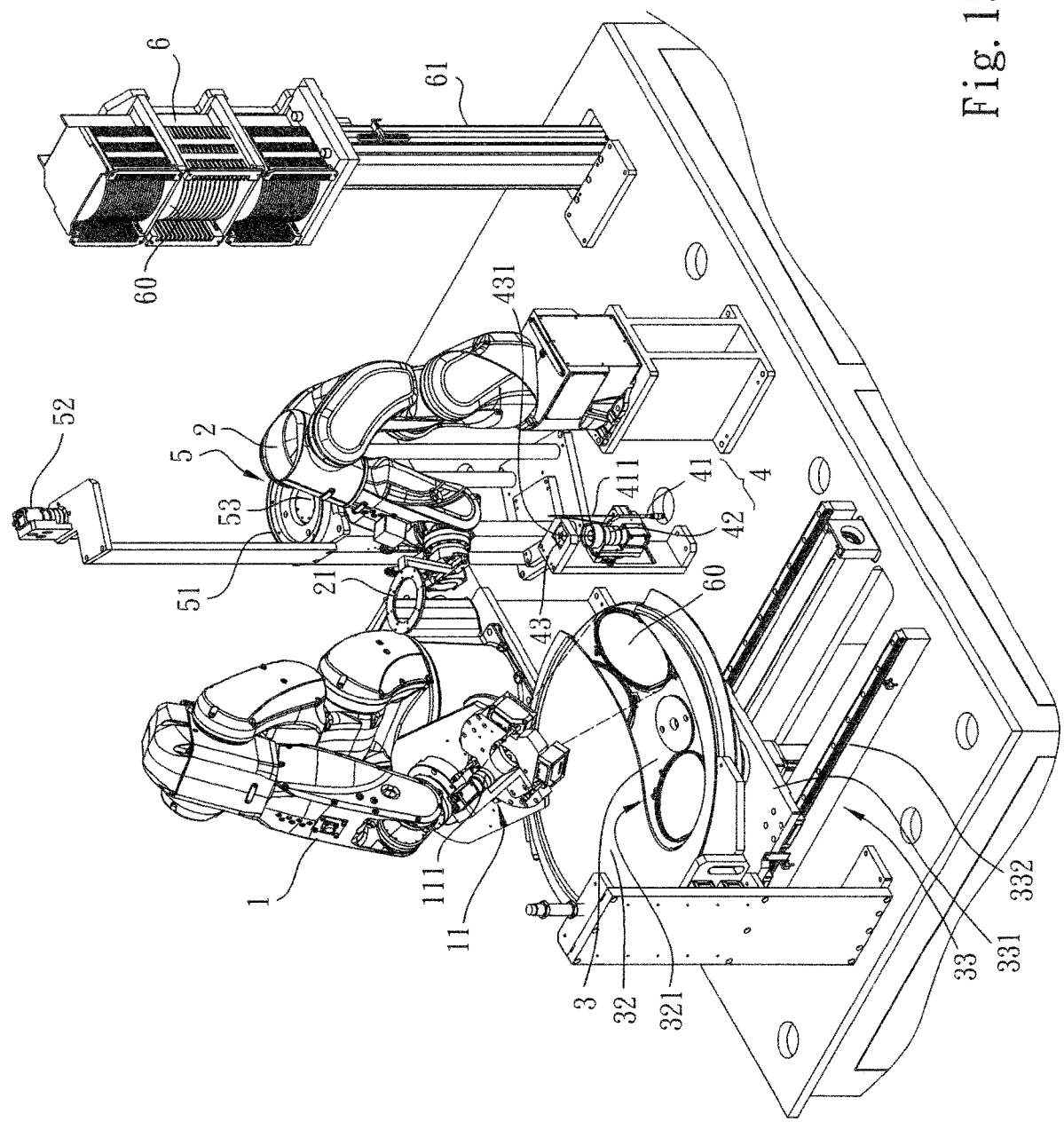
FIG. 15 is a perspective view of the present invention, showing that the image capturing assembly ensures the position of the wafer to be processed on the carrier disc.

In step S18 of making the wafer taking/placing mechanism move the wafer to be processed onto the wafer disc, the second robotic arm 2 drives the wafer taking/placing mechanism 21 to take out the wafer 60 to be processed with the true notch angle from the rest seat 51 of the wafer correction mechanism 5 and place the wafer 60 through the breach 321 of the outer cover 32 onto the wafer disc 31 of the carrier disc 3 (as shown in FIG. 14).

step S19 of making the image capturing assembly obtain the image of the wafer to be processed, the first robotic arm 1 drives the image capturing assembly 11 to move to the upper side of the breach 321 of the outer cover 32 (as shown in FIG. 15) and obtain the image of the wafer 60 to be processed, which is placed on the wafer disc 31 in the preceding step so as to ensure that the wafer 60 to be processed is complete and placed in a true position.

Figure 16:
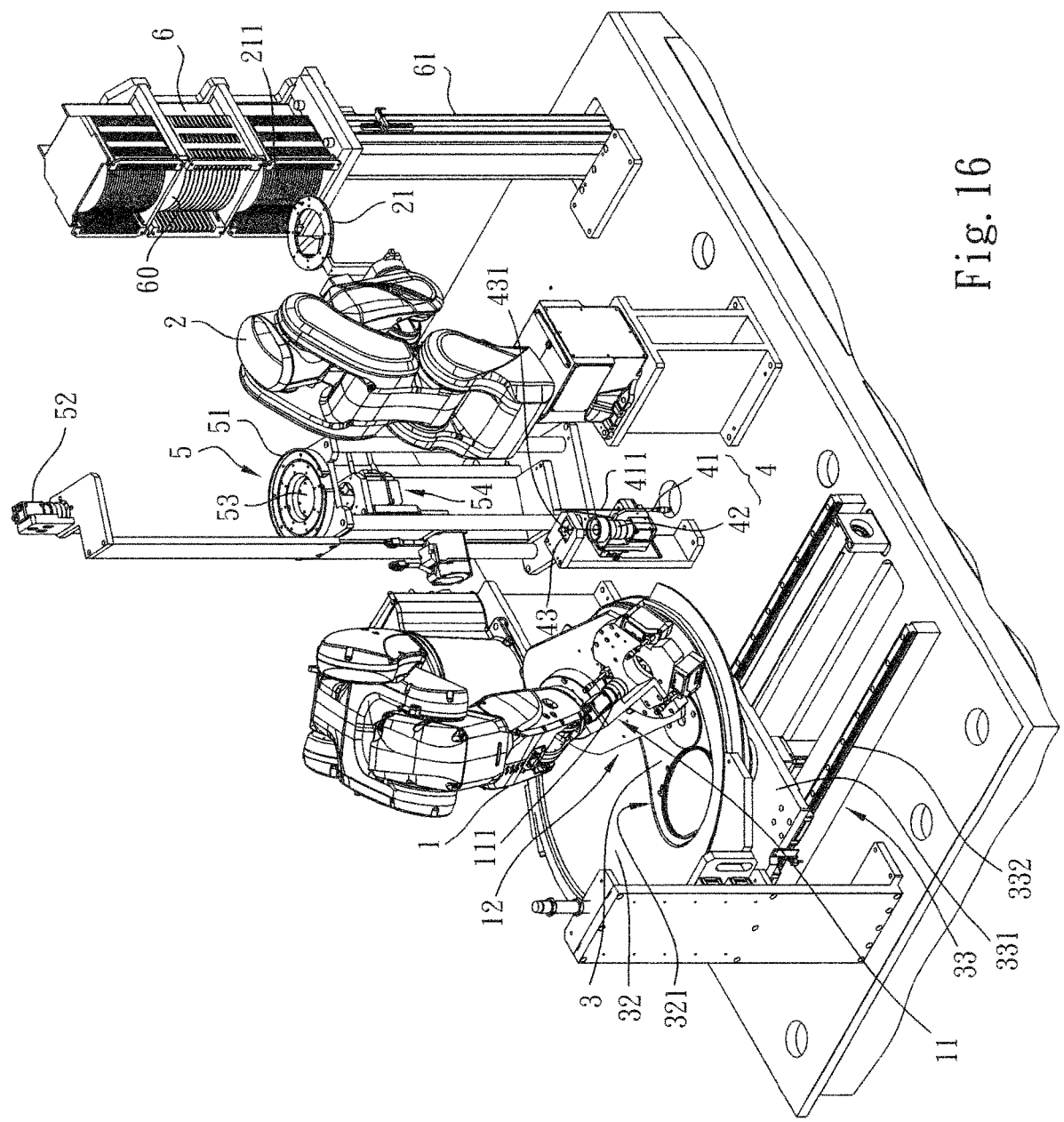
FIG. 16 is a perspective view of the present invention, showing that the wafer locating member installation/uninstallation mechanism is moved to the upper side of the wafer disc to install the wafer locating member.
Figure 17:
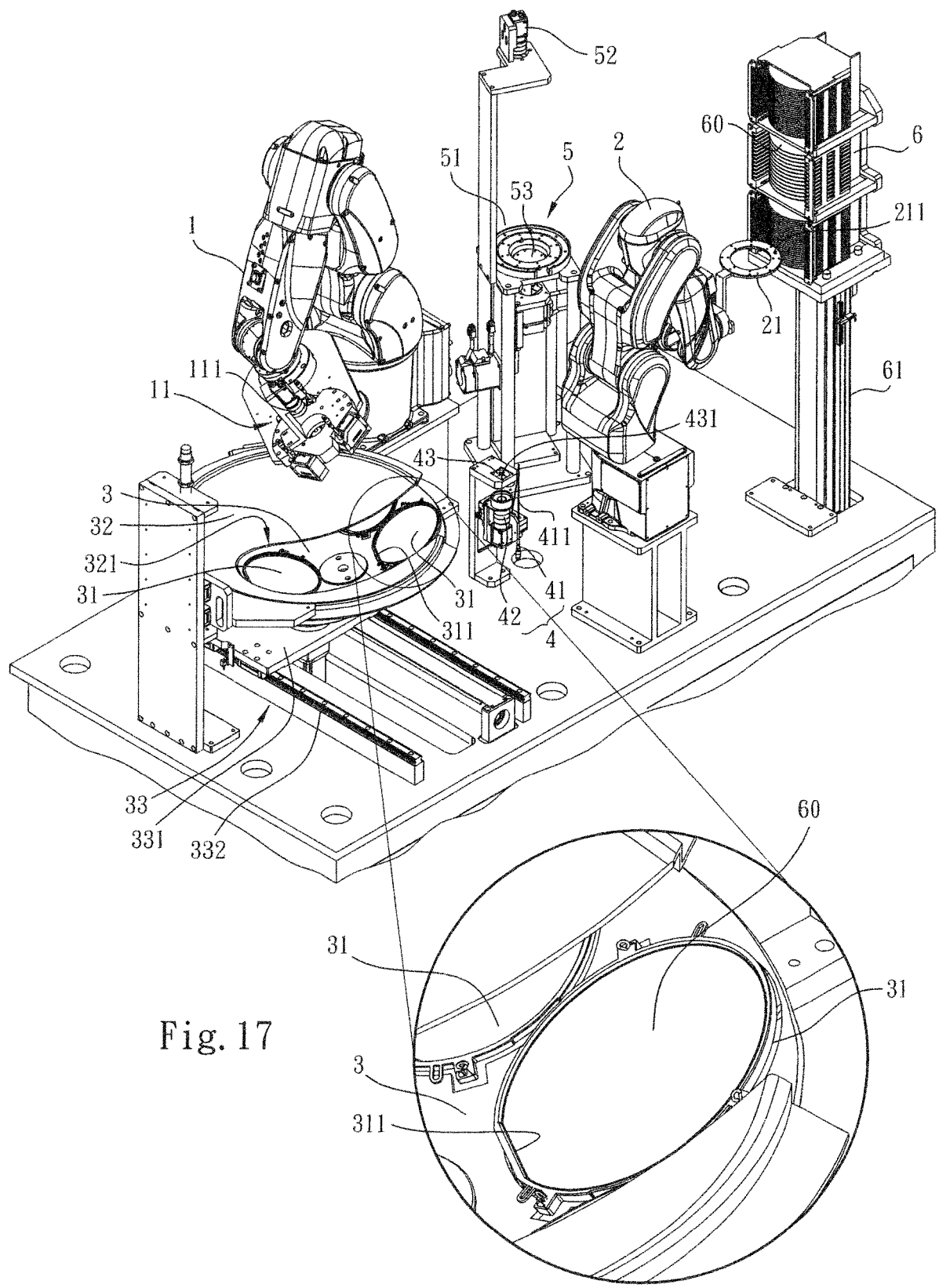
FIG. 17 is a perspective view of the present invention, showing that the wafer locating member installation/uninstallation mechanism is moved back to its home position and the wafer locating member is secured on the wafer disc.

In step S20 of making the wafer locating member installation/uninstallation mechanism install the wafer locating member on the wafer disc to secure the wafer to be processed, the first robotic arm 1 drives the wafer locating member installation/uninstallation mechanism 12 to connect and lock the wafer locating member 311 held by the holding components 123 on the wafer disc 31 (as shown in FIG. 16). The wafer locating member 311 presses the circumference of the wafer 60 to be processed so as to locate the same (as shown in FIG. 17).

Thereafter, the pivotally rotational seat 333 drives the carrier disc 3 to rotate to rotate the wafer disc 31, on which the wafer 60 to be processed is placed, to the lower side of the outer cover 32. At the same time, another vacant wafer disc 31 (free from the wafer 60 to be processed) is moved to the lower side of the breach 321 of the outer cover 32 and exposed to outer side. Accordingly, the above steps S13, S14, S16, S17, S18, S19 and S20 are sequentially repeatedly performed to respectively secure different wafers 60 to be processed on the wafer discs 31.

Figure 18:
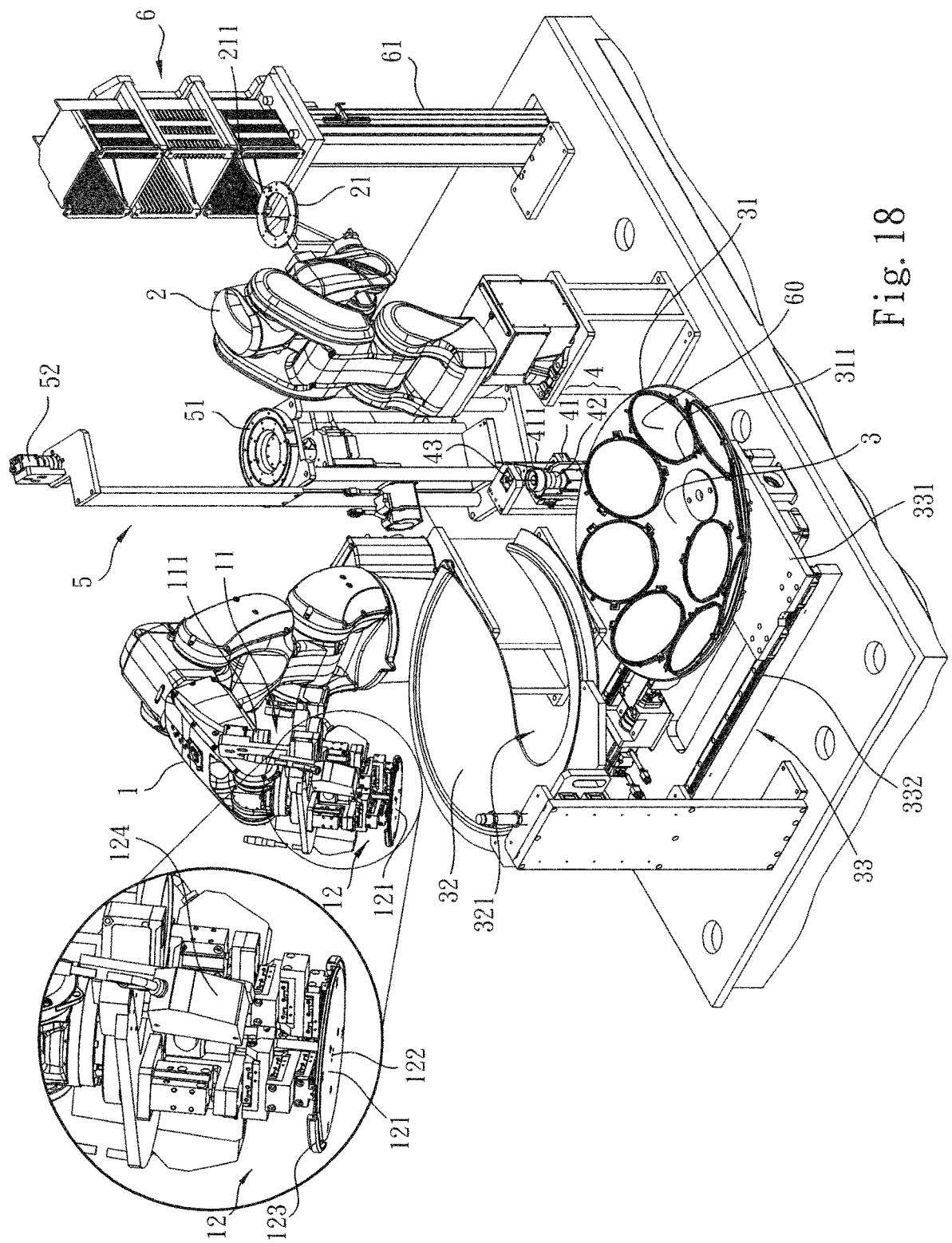
FIG. 18 is a perspective view of the present invention, showing that the carrier disc is moved out of the outer cover.

In step S21 of outward moving the carrier disc, after the wafers 60 to be processed are placed on all the wafer discs 31 of the carrier disc 3, the slide seat 331 of the slide mechanism 33 outward slides along the slide guide rails 332 to a predetermined position outside the outer cover 32 (as shown in FIG. 18), whereby the carrier disc 3 can be conveniently moved for the next processing procedure.

Figure 19:
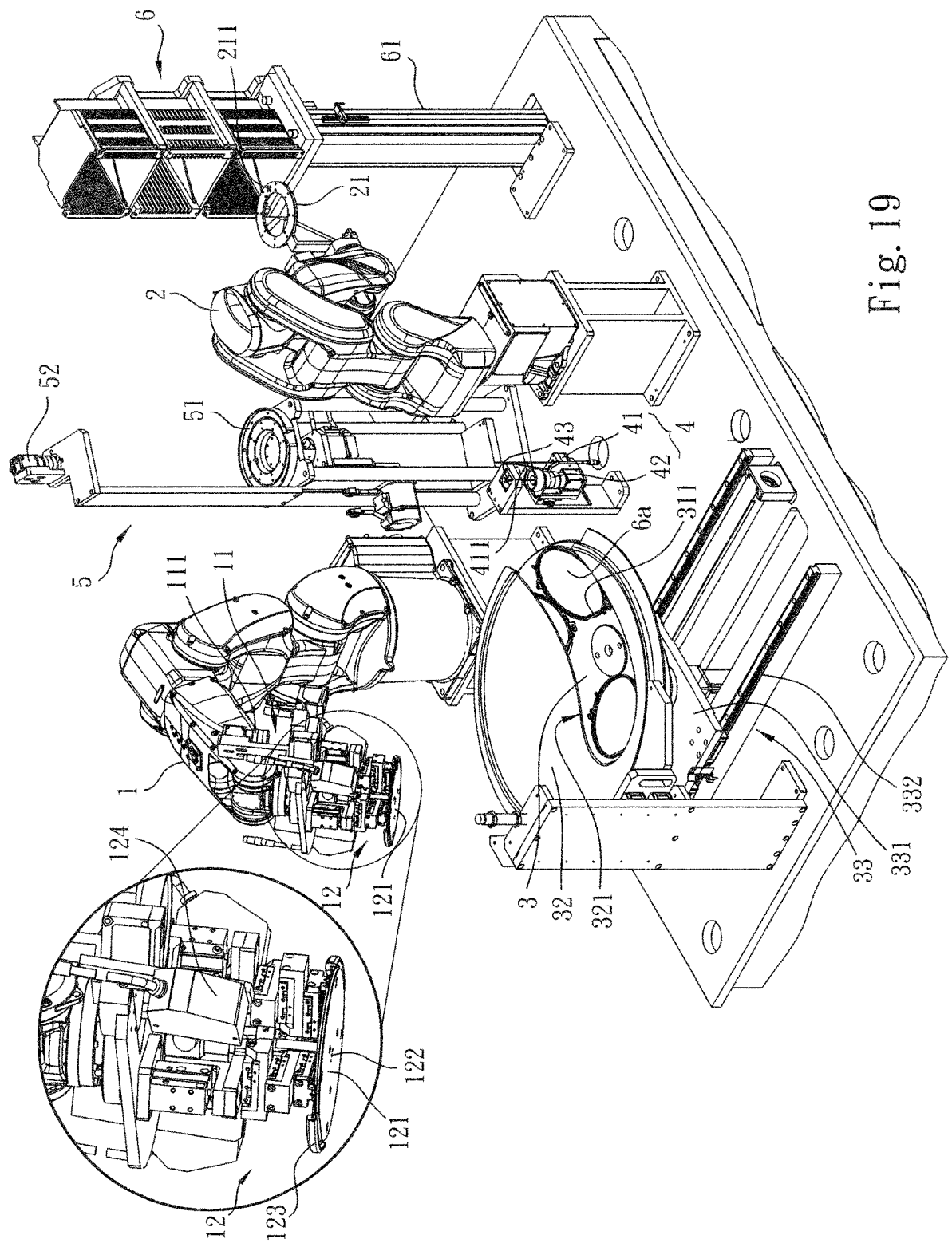
FIG. 19 is a perspective view of the present invention, showing that after the wafer is processed, the carrier disc is moved back to the lower side of the outer cover.

In step S22 of moving the carrier disc back to home position, after all the wafers 60 placed on the wafer discs 31 of the carrier disc 3 are completely processed into processed wafers 6a, the carrier disc 3 is placed on the pivotally rotational seat 333 (the slide seat 331) of the slide mechanism 33. Then the pivotally rotational seat 333 (the slide seat 331) is slid along the slide guide rails 332 to the lower side of the outer cover 32 and the processed wafer 6a on one of the wafer discs 31 is positioned under the breach 321 and exposed to outer side (as shown in FIG. 19).

Figure 20:
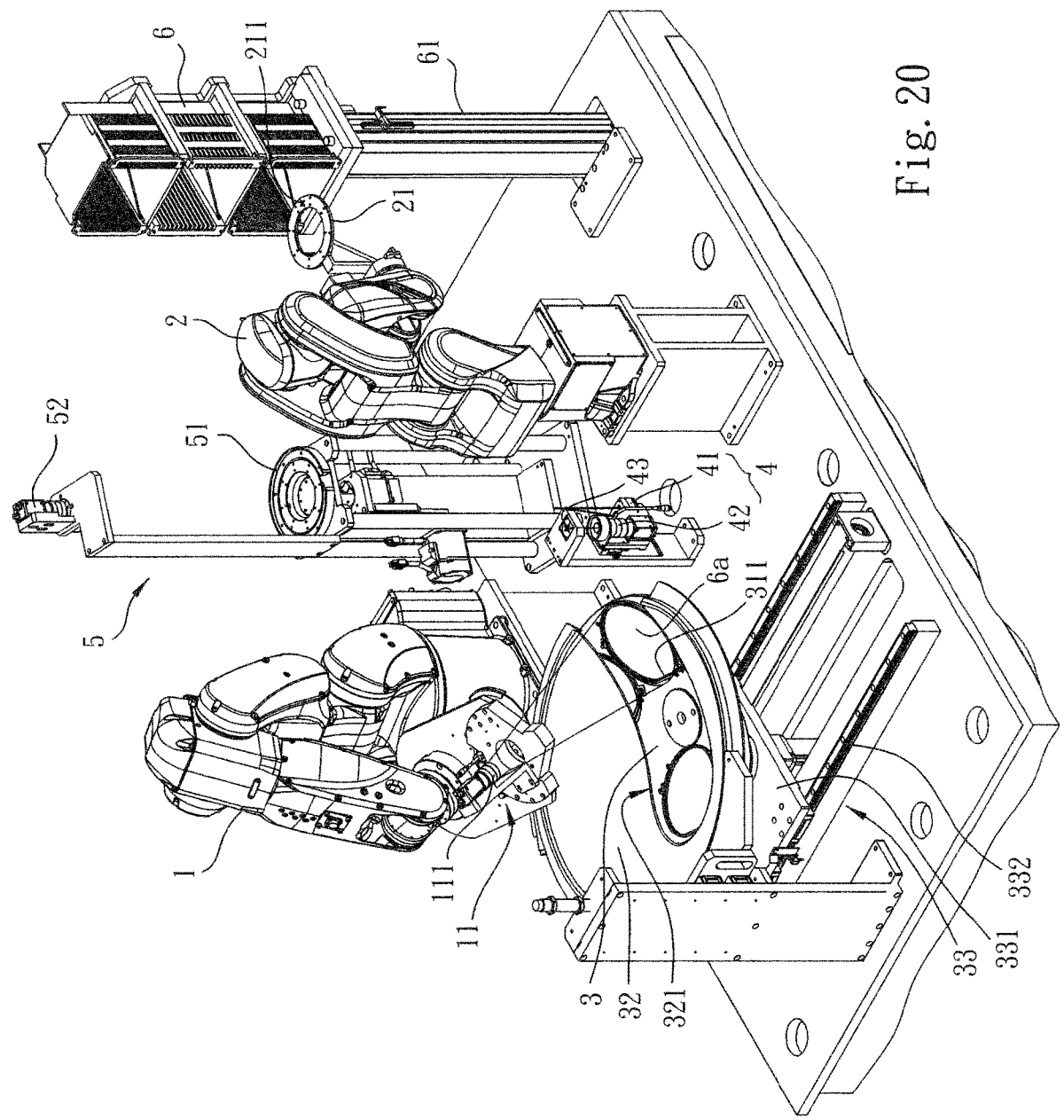
FIG. 20 is a perspective view of the present invention, showing that the image capturing assembly is positioned above the carrier disc truly corresponding to the wafer disc.

In step S23 of making the image capturing assembly truly correspond to the wafer disc, the first robotic arm 1 drives the image capturing assembly 11 to move to the upper side of the breach 321 of the outer cover 32 (as shown in FIG. 20) to obtain the image of the wafer 6a placed on the wafer disc 31 corresponding to the breach 321 so as to check the condition of the processed wafer 6a on the wafer disc 31 (whether the wafer 6a is broken, damaged or abnormal).

Figure 21:
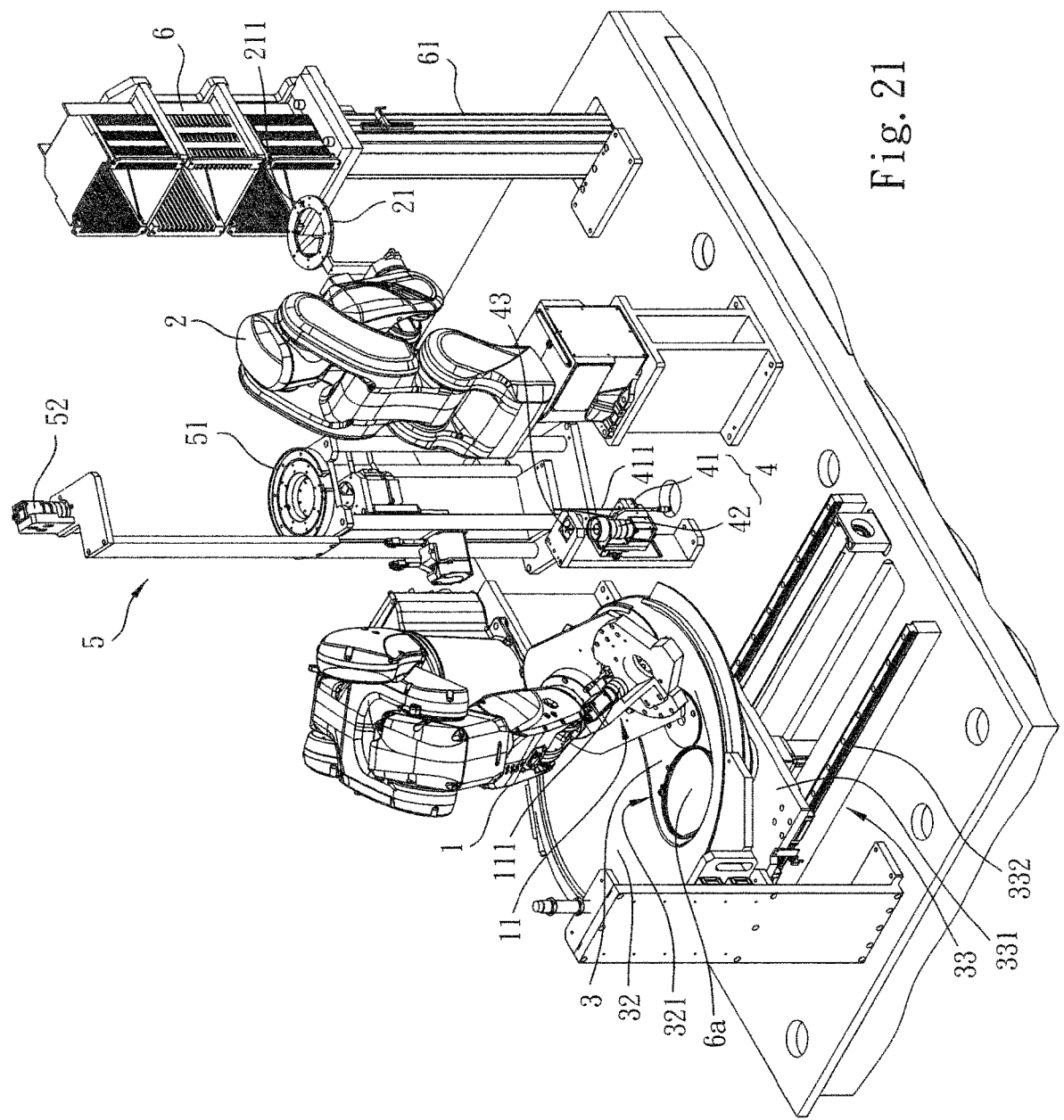
FIG. 21 is a perspective view of the present invention, showing that the wafer locating member installation/uninstallation mechanism is moved to the upper side of the wafer disc to take off the wafer locating member.
Figure 22:
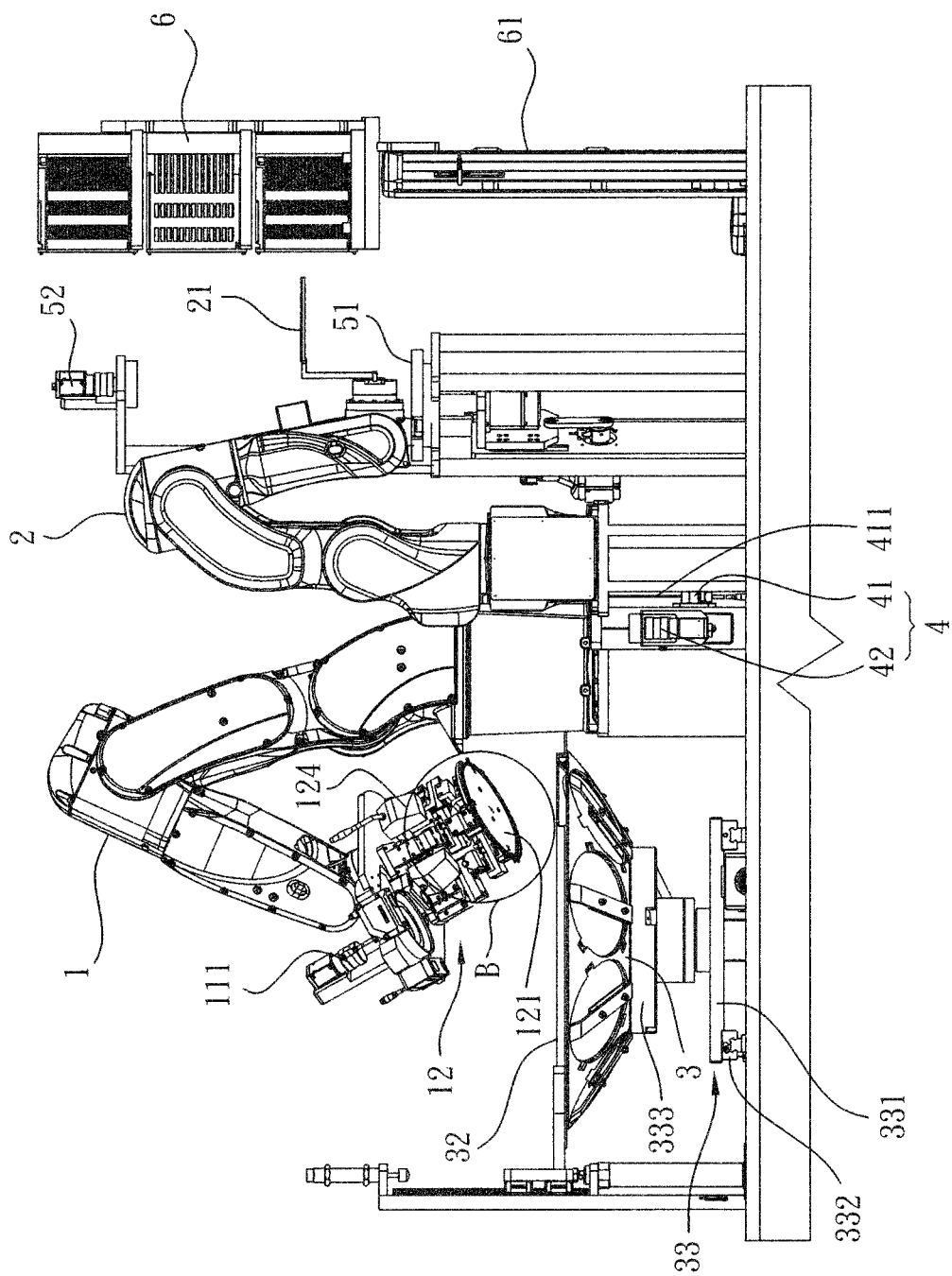
FIG. 22 is a perspective view of the present invention, showing that the wafer locating member installation/uninstallation mechanism takes off the wafer locating member.
Figure 23:
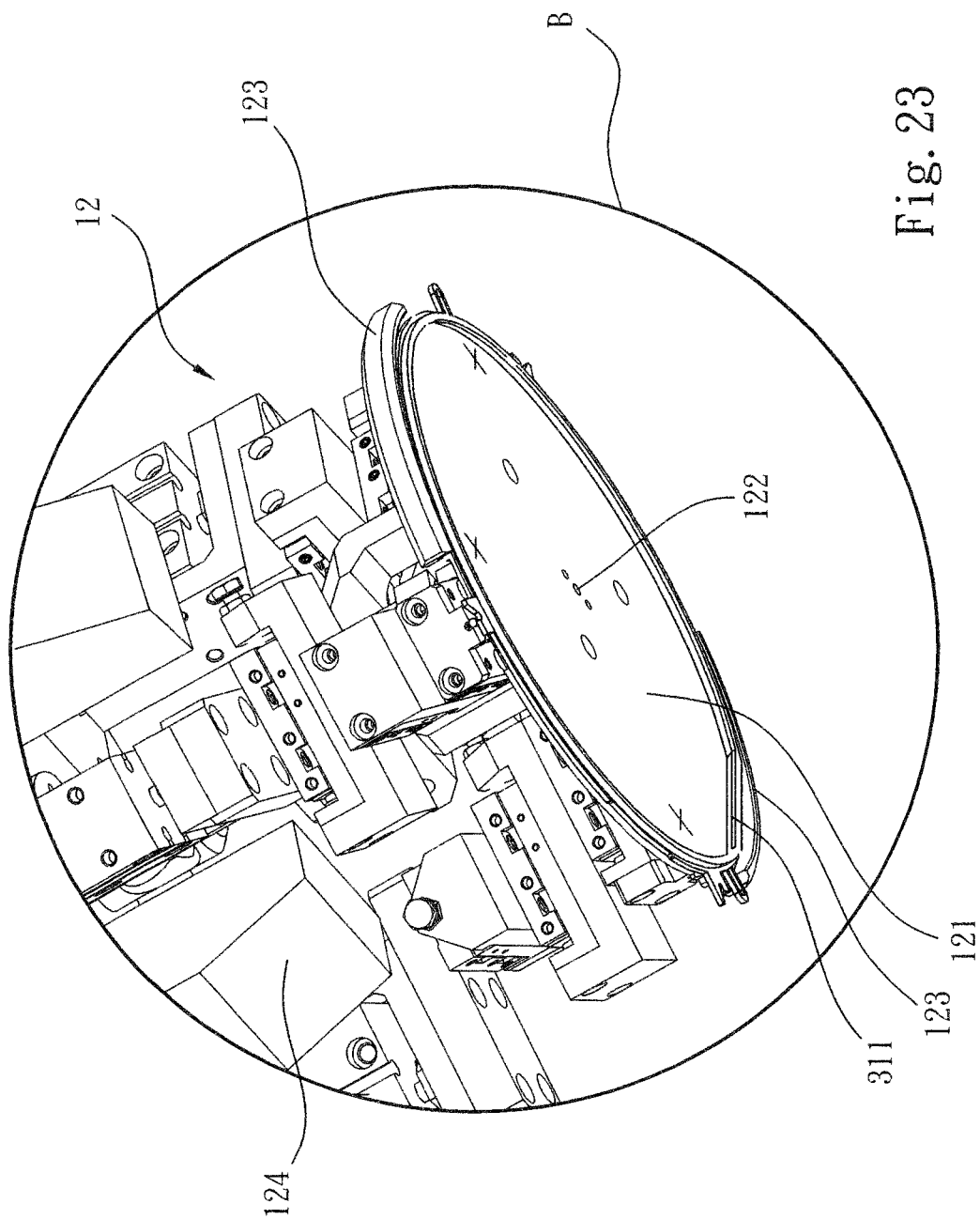
FIG. 23 is an enlarged view of circled area B of FIG. 22.

In step S24 of making the wafer locating member installation/uninstallation mechanism take off the wafer locating member from the wafer disc, with reference to the relative position coordinate, the control module drives the first robotic arm 1 to drive the wafer locating member installation/uninstallation mechanism 12 to approach the wafer disc 31 corresponding to the breach 321 and then drive the wafer locating member installation/uninstallation mechanism 12 to adjust the position. The laser source 124 generates and projects multiple (at least three) laser beams with the same length onto the wafer disc 31 so as to make the locating face 121 aligned with (in parallel to) the wafer disc 31 (as shown in FIG. 21). Then, after the wafer locating member 311 previously disposed on the circumference of the wafer disc 31 is unlocked by the wafer locating member installation/uninstallation mechanism 12, the holding components 123 are used to take out the wafer locating member 311 and keep in a holding state (as shown in FIGS. 22 and 23).

Figure 24:
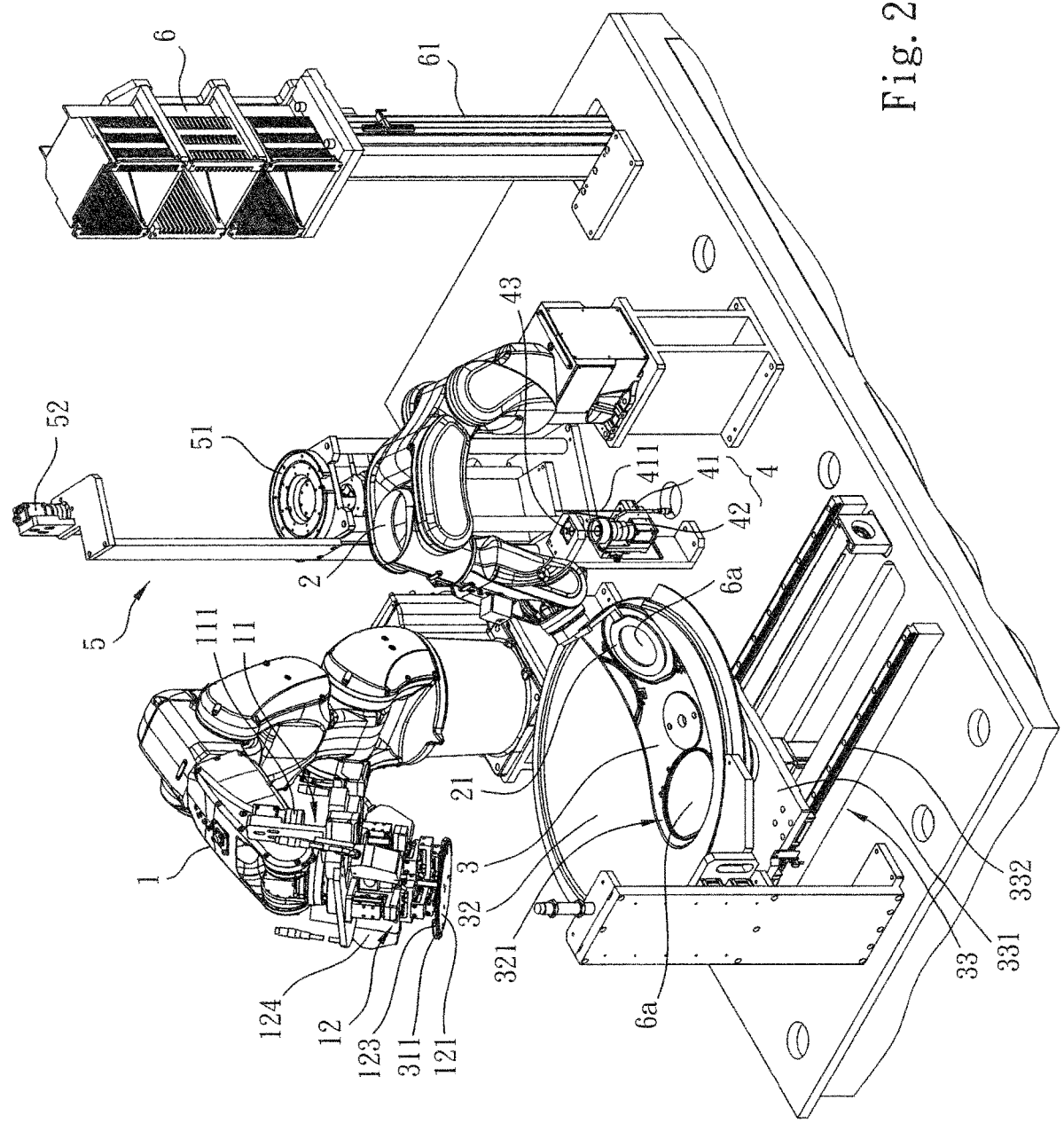
FIG. 24 is a perspective view of the present invention, showing that the wafer taking/placing mechanism takes off the processed wafer from the wafer disc.
Figure 25:
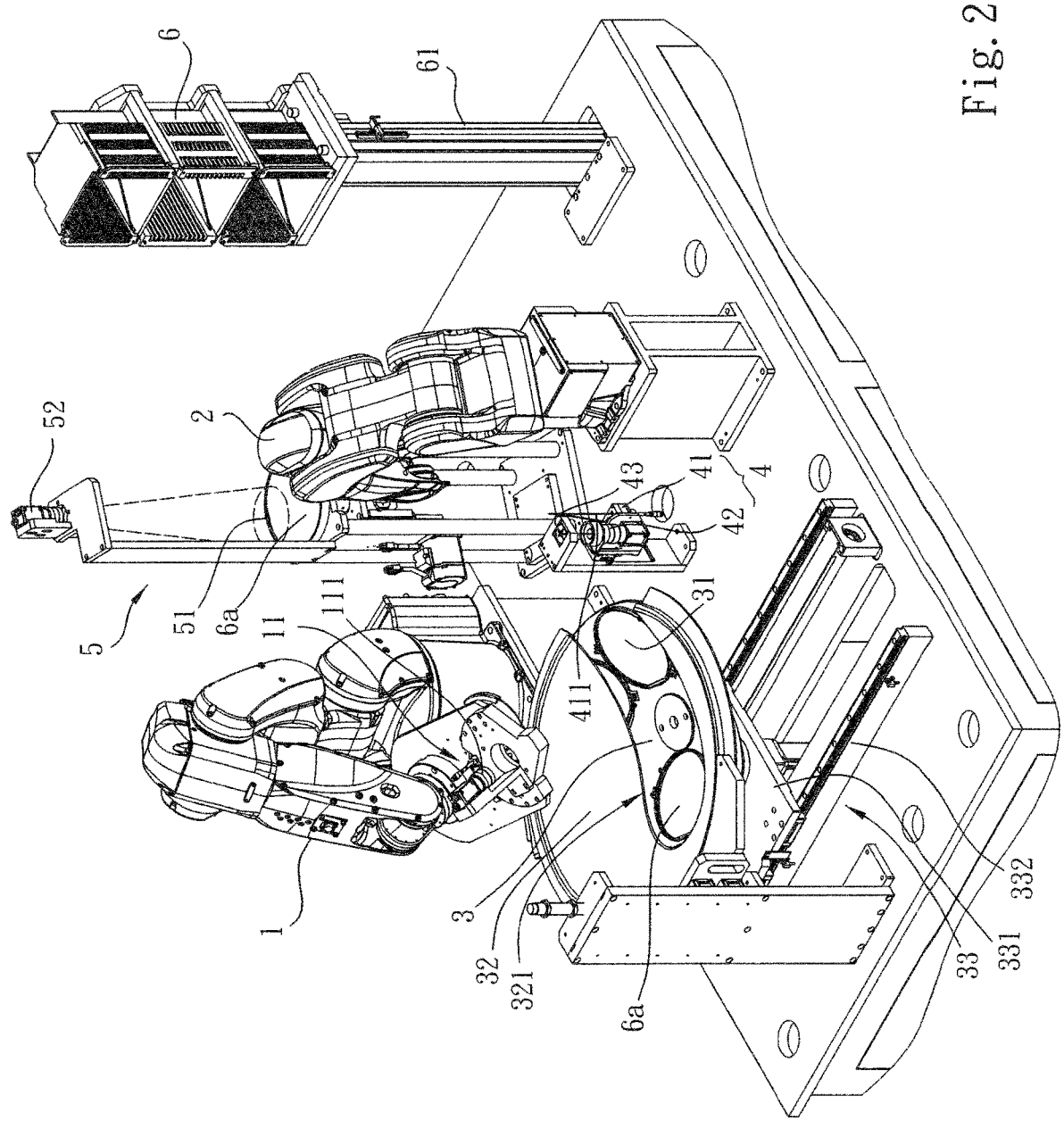
FIG. 25 is a perspective view of the present invention, showing that the wafer correction mechanism reads the code of the processed wafer.

In step S25 of making the wafer taking/placing mechanism take off the processed wafer from the wafer disc and making the wafer correction mechanism read the code of the processed wafer, the second robotic arm 2 drives the wafer taking/placing mechanism 21 to move to the upper side of the wafer disc 31 of the carrier disc 3, (which is exposed under the breach 321), to suck the processed wafer 6a (as shown in FIG. 24) and move the processed wafer 6a onto the rest seat 51 of the wafer correction mechanism 5. The image capturing unit 52 reads the code of the processed wafer 6a (as shown in FIG. 25) and the control module records the code of the processed wafer 6a.

Figure 26:
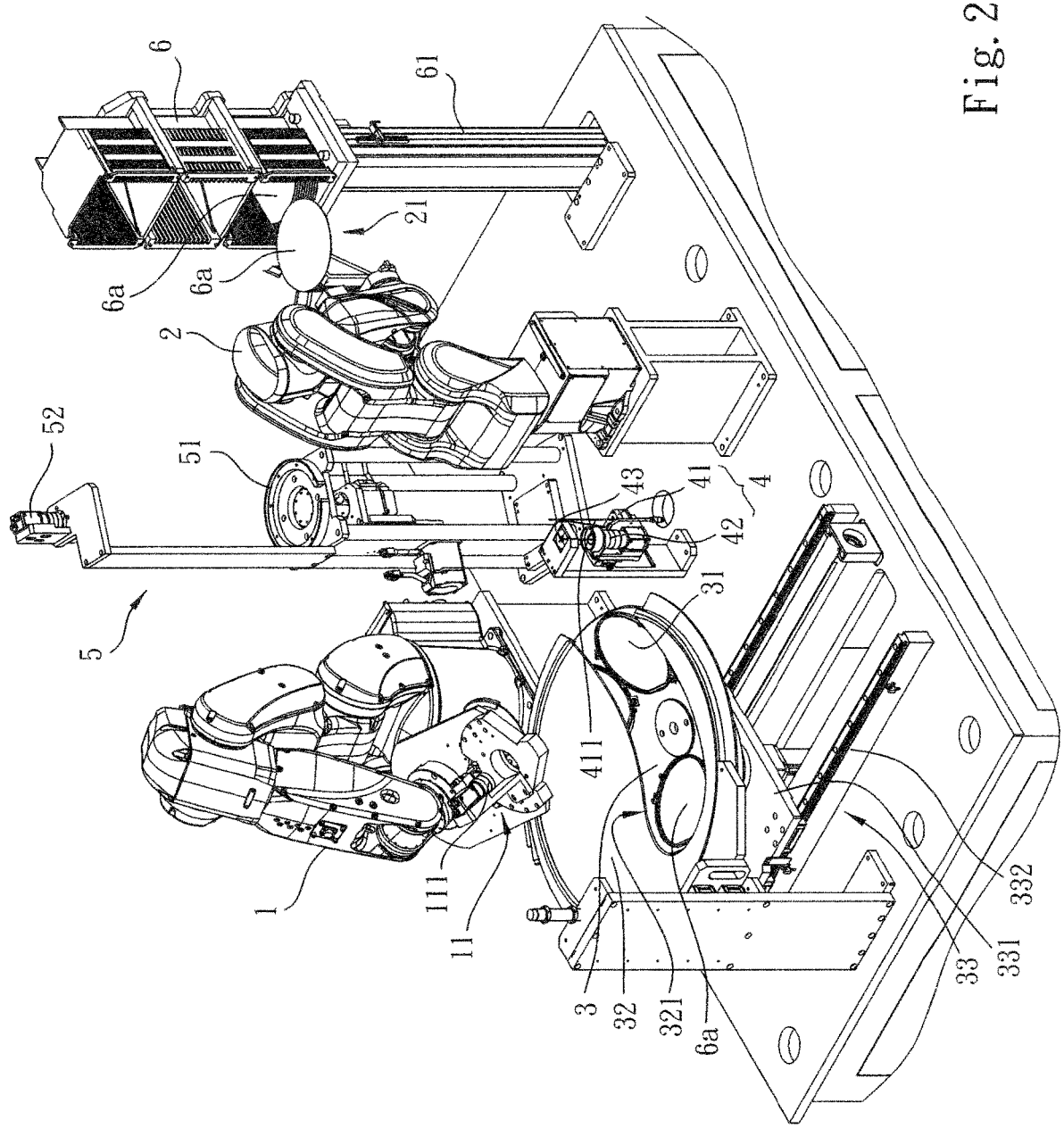
FIG. 26 is a perspective view of the present invention, showing that the wafer taking/placing mechanism places the processed wafer into the material rest mechanism.

In step S26 of making the wafer taking/placing mechanism place the processed wafer into the material rest mechanism, the second robotic arm 2 drives the wafer taking/placing mechanism 21 to take out the processed wafer 6a from the rest seat 51. The lifting mechanism 61 cooperatively drives the material rest mechanism 6 (material receiving cartridge) to ascend/descend so as to place the processed wafer 6a into the space of the material rest mechanism 6 (as shown in FIG. 26).

Then, the pivotally rotational seat 333 drives the carrier disc 3 to rotate and make the wafer disc 31, from which the wafer 6a has been taken out, rotate to the lower side of the outer cover 32. At the same time, another wafer disc 31, on which the processed wafer 6a has been placed, is moved to the lower side of the breach 321 of the outer cover 32 and exposed to outer side. Accordingly, the aforesaid steps S14, S15, S17 and S18 are sequentially repeatedly performed to respectively move the processed wafers 6a on different wafer discs 31 into the material rest mechanism 6 (material receiving cartridge). Finally, after all the processed wafers 6a are taken out from the carrier disc 3, the slide seat 331 (pivotally rotational seat 333) of the slide mechanism 33 drives the carrier disc 3 to outward slide along the slide guide rails 332 so as to take out the vacant carrier disc 3. Thereafter, a carrier disc 3 with the processed wafers 6a is placed onto the pivotally rotational seat 333.

In conclusion, the wafer carrier disc installation/uninstallation device and the installation/uninstallation method thereof of the present invention can truly achieve the effects of lowering labor cost, enhancing moving efficiency and ensuring that the wafer is placed on the wafer disc in true direction at high precision. The present invention is inventive and advanced.

The above embodiments are only used to illustrate the present invention, not intended to limit the scope thereof. Many modifications of the above embodiments can be made without departing from the spirit of the present invention.

What is claimed is:

1. A wafer carrier disc installation/uninstallation device comprising:
   a first robotic arm connected with and drivable by a control module, at least an image capturing assembly being disposed at a movable end of the first robotic arm;
   a second robotic arm connected with and drivable by the control module, a wafer taking/placing mechanism being disposed at a movable end of the second robotic arm;
   a carrier disc disposed within a moving range of the first and second robotic arms, the carrier disc being connected with and drivable by the control module, at least one wafer disc being disposed on the carrier disc for placing a wafer on the wafer disc;
   a main correction mechanism positioned within the moving range of the first and second robotic arms, the main correction mechanism being connected with and drivable by the control module to respectively correct the operation positions of the image capturing assembly and the wafer taking/placing mechanism, wherein the main correction mechanism has a lower image capturing component and a range-finding laser source is disposed on the lower image capturing component of the main correction mechanism;
   a wafer correction mechanism positioned within the moving range of the second robotic arm, the wafer correction mechanism being connected with and drivable by the control module to read a code of the wafer placed therein and adjust the position of the wafer, and multiple laser sources being disposed on a locating face of the wafer locating member installation/uninstallation mechanism;
   a material rest mechanism disposed within the moving range of the second robotic arm, the material rest mechanism having an internal space for receiving wafers, and
   a lockable wafer locating member is secured on each wafer disc, a wafer locating member installation/uninstallation mechanism being further disposed at the movable end of the first robotic arm to install/uninstall the wafer locating member.

2. The wafer carrier disc installation/uninstallation device as claimed in claim 1, wherein the image capturing assembly has an upper image capturing component capable of generating illuminating light beam, the main correction mechanism further having a standard scale being disposed on the lower image capturing component as a locating reference, a locating scale being disposed on the wafer locating member installation/uninstallation mechanism, the wafer taking/placing mechanism having a wafer sucker for sucking the wafer, and an indication scale being disposed on the wafer sucker.

3. The wafer carrier disc installation/uninstallation device as claimed in claim 1, wherein the carrier disc is disposed on a slide mechanism, the slide mechanism having a slide seat, which can move along multiple slide guide rails extending in parallel to each other, a pivotally rotational seat being disposed on the slide seat for supporting the carrier disc.

4. The wafer carrier disc installation/uninstallation device as claimed in claim 1, wherein the carrier disc is disposed on a slide mechanism, the slide mechanism having a slide seat, which can move along multiple slide guide rails extending in parallel to each other, a pivotally rotational seat being disposed on the slide seat for supporting the carrier disc.

5. The wafer carrier disc installation/uninstallation device as claimed in claim 1, wherein the wafer correction mechanism has a rest seat for placing the wafer thereon, a center of the rest seat being formed with a through hole, an image capturing unit being disposed above the rest seat, a sucker with vacuum sucking orifices being disposed under the through hole of the rest seat, the sucker being drivable by a rotational drive mechanism to ascend/descend and pivotally rotate.

6. The wafer carrier disc installation/uninstallation device as claimed in claim 1, wherein the wafer correction mechanism has a rest seat for placing the wafer thereon, a center of the rest seat being formed with a through hole, an image capturing unit being disposed above the rest seat, a sucker with vacuum sucking orifices being disposed under the through hole of the rest seat, the sucker being drivable by a rotational drive mechanism to ascend/descend and pivotally rotate.

7. An installation method employing the wafer carrier disc installation/uninstallation device as claimed in claim 1, comprising steps of:

correcting image capturing range of the image capturing assembly, the first robotic arm driving the image capturing assembly to move to the upper side of the main correction mechanism so as to correct the image capturing range of the image capturing assembly to a true position;

correcting operation position of the wafer locating member installation/uninstallation mechanism, the first robotic arm driving the wafer locating member installation/uninstallation mechanism to move to the upper side of the main correction mechanism so as to adjust and correct the operation position of the wafer locating member installation/uninstallation mechanism, the control module comparing the operation position of the wafer locating member installation/uninstallation mechanism with the image capturing range of the image capturing assembly and storing a relative position coordinate therebetween;

making the image capturing assembly truly correspond to the wafer disc, the first robotic arm driving the image capturing assembly to move to the upper side of the carrier disc and correct the position to precisely correspond to the wafer discs on the carrier disc so as to check the condition on the wafer disc;

making the wafer locating member installation/uninstallation mechanism take off the wafer locating member from the wafer disc, with reference to the relative position coordinate, the control module driving the first robotic arm to drive the wafer locating member installation/uninstallation mechanism to be aligned with the wafer disc and take out the wafer locating member previously disposed on the wafer disc;

correcting the operation position of the wafer taking/placing mechanism, the second robotic arm driving the wafer taking/placing mechanism to move to the upper side of the main correction mechanism so as to correct the operation position of the wafer taking/placing mechanism;

making the wafer taking/placing mechanism place the wafer to be processed onto the wafer correction mechanism, the second robotic arm driving the wafer taking/placing mechanism to move into the material rest mechanism to take out the wafer to be processed and place the wafer to be processed into the wafer correction mechanism;

making the wafer taking/placing mechanism read the code of the wafer to be processed and rotate the notch of the wafer to be processed to a true angle, the wafer correction mechanism obtaining the code and the position of the wafer to be processed and the wafer to be processed being rotated so as to adjust the wafer to be processed to a true position;

making the wafer taking/placing mechanism move the wafer to be processed onto the wafer disc, the second robotic arm driving the wafer taking/placing mechanism to take out the wafer to be processed from the wafer correction mechanism and place the wafer onto the wafer disc of the carrier disc;

making the image capturing assembly obtain the image of the wafer to be processed, the first robotic arm driving the image capturing assembly to move to the upper side of the carrier disc and obtain the image of the wafer to be processed, which is previously placed on the wafer disc so as to ensure that the wafer to be processed is complete; and making the wafer locating member installation/uninstallation mechanism install the wafer locating member on the wafer disc to secure the wafer to be processed, the first robotic arm driving the wafer locating member installation/uninstallation mechanism to connect the wafer locating member on the wafer disc, the wafer locating member pressing the wafer to be processed so as to locate the same, then the control module driving the carrier disc to move to a predetermined position to be processed.

8. The installation method as claimed in claim 7, wherein a lower image capturing component is disposed in the main correction mechanism, a transparent sheet is above the lower image capturing component, a standard scale is disposed on the transparent sheet as a locating reference, and an upper image capturing component is disposed in the image capturing assembly, a position of the standard scale obtained from at least one of the upper and lower image capturing components and the wafer taking/placing mechanism being with the image capturing range thereof according to the locating reference, in case the position of the standard scale of the upper image capturing component is deflected from the position of the standard scale of the lower image capturing component, then the control module via the first robotic arm driving the image capturing assembly to adjust the position so as to overlap the position of the standard scale of the upper image capturing component with the position of the standard scale of the lower image capturing component; in case the position of the standard scale of the wafer taking/placing mechanism is deflected from the position of the standard scale of the lower image capturing component, then the control module via the second robotic arm driving the wafer taking/placing mechanism to adjust the position so as to overlap the position of the standard scale of the wafer taking/placing mechanism and the position of the lower image capturing component to be corrected to a true operation position.

9. The installation method as claimed in claim 7, wherein a lower image capturing component is disposed in the main correction mechanism and a range-finding laser source is disposed beside the lower image capturing component, the range-finding laser source serving to generate laser beams to respectively measure the distance between the image capturing assembly and the lower image capturing component, the distance between the wafer locating member installation/uninstallation mechanism and the lower image capturing component and the distance between the wafer taking/placing mechanism and the lower image capturing component, whereby the control module can adjust the focal length of the lens of the lower image capturing component.

10. The installation method as claimed in claim 7, wherein at least three laser sources are disposed around the wafer locating member installation/uninstallation mechanism, in the step of making the wafer locating member installation/uninstallation mechanism take off the wafer locating member from the wafer disc, the control module driving the first robotic arm to drive the wafer locating member installation/uninstallation mechanism to adjust the position, whereby the laser sources generate and project laser beams with the same length onto the wafer disc so as to make the wafer locating member installation/uninstallation mechanism truly correspond to the wafer disc.

11. The installation method as claimed in claim 7, wherein the wafer correction mechanism at least has a rest seat for placing the wafer thereon, an image capturing unit for obtaining the code and notch position of the wafer and a rotational drive mechanism, the rotational drive mechanism serving to drive the wafer to rotate so as to adjust the notch of the wafer to a true angle.

12. An uninstallation method employing the wafer carrier disc installation/uninstallation device as claimed in claim 1, comprising steps of:
   correcting image capturing range of the image capturing assembly, before the carrier disc, on which the processed wafer has been placed, is moved from the outer side back to the lower side of the outer cover, the first robotic arm driving the image capturing assembly to move to the upper side of the main correction mechanism so as to correct the image capturing range of the image capturing assembly to a true position;
   correcting operation position of the wafer locating member installation/uninstallation mechanism, the first robotic arm driving the wafer locating member installation/uninstallation mechanism to move to the upper side of the main correction mechanism so as to adjust and correct the operation position of the wafer locating member installation/uninstallation mechanism, the control module comparing the operation position of the wafer locating member installation/uninstallation mechanism with the image capturing range of the image capturing assembly and storing a relative position coordinate therebetween;
   correcting the operation position of the wafer taking/placing mechanism, the second robotic arm driving the wafer taking/placing mechanism to move to the upper side of the main correction mechanism so as to correct the operation position of the wafer taking/placing mechanism;
   making the image capturing assembly truly correspond to the wafer disc, after the carrier disc, on which the processed wafer is placed, is moved from the outer side back to the lower side of the outer cover, the first robotic arm driving the image capturing assembly to move to the upper side of the carrier disc and correct the position to precisely correspond to the wafer discs on the carrier disc so as to check the condition of the processed wafer on the wafer disc;
   making the wafer locating member installation/uninstallation mechanism take off the wafer locating member from the wafer disc, with reference to the relative position coordinate, the control module driving the first robotic arm to drive the wafer locating member installation/uninstallation mechanism to be aligned with the wafer disc and take out the wafer locating member disposed on the wafer disc to secure the processed wafer;
   making the wafer taking/placing mechanism take off the processed wafer from the wafer disc and making the wafer correction mechanism read the code of the processed wafer, the second robotic arm driving the wafer taking/placing mechanism to move to the upper side of the wafer disc of the carrier disc to take out the processed wafer and place the processed wafer into the wafer correction mechanism so as to read the code of the processed wafer; and
   making the wafer taking/placing mechanism place the wafer into the material rest mechanism, the wafer taking/placing mechanism moving the processed wafer into the material rest mechanism.

13. The uninstallation method as claimed in claim 12, wherein a lower image capturing component is disposed in the main correction mechanism, a transparent sheet is above the lower image capturing component, a standard scale is disposed on the transparent sheet as a locating reference, and an upper image capturing component is disposed in the image capturing assembly, a position of the standard scale obtained from at least one of the upper and lower image capturing components and the wafer taking/placing mechanism being with the image capturing range thereof according to the locating reference, in case the position of the standard scale of the upper image capturing component is deflected from the position of the standard scale of the lower image capturing component, then the control module via the first robotic arm driving the image capturing assembly to adjust the position so as to overlap the position of the standard scale of the upper image capturing component with the position of the standard scale of the lower image capturing component; in case the position of the standard scale of the wafer taking/placing mechanism is deflected from the position of the standard scale of the lower image capturing component, then the control module via the second robotic arm driving the wafer taking/placing mechanism to adjust the position so as to overlap the position of the standard scale of the wafer taking/placing mechanism and the position of the lower image capturing component to be corrected to a true operation position.

14. The uninstallation method as claimed in claim 12, wherein a lower image capturing component is disposed in the main correction mechanism and a range-finding laser source is disposed beside the lower image capturing component, the range-finding laser source serving to generate laser beams to respectively measure the distance between the image capturing assembly and the lower image capturing component, the distance between the wafer locating member installation/uninstallation mechanism and the lower image capturing component and the distance between the wafer taking/placing mechanism and the lower image capturing component, whereby the control module can adjust the focal length of the lens of the lower image capturing component.

15. The uninstallation method as claimed in claim 12, wherein at least three laser sources are disposed around the wafer locating member installation/uninstallation mechanism, in the step of making the wafer locating member installation/uninstallation mechanism take off the wafer locating member from the wafer disc, the control module driving the first robotic arm to drive the wafer locating member installation/uninstallation mechanism to adjust the position, whereby the laser sources generate and project laser beams with the same length onto the wafer disc so as to make the wafer locating member installation/uninstallation mechanism truly correspond to the wafer disc.

16. The uninstallation method as claimed in claim 12, wherein the wafer correction mechanism at least has a rest seat for placing the wafer thereon, an image capturing unit for obtaining the code and notch position of the wafer and a rotational drive mechanism, the rotational drive mechanism serving to drive the wafer to rotate so as to adjust the notch of the wafer to a true angle.

17. An installation method employing the wafer carrier disc installation/uninstallation device as claimed in claim 3, comprising steps of:
   correcting image capturing range of the image capturing assembly, the first robotic arm driving the image capturing assembly to move to the upper side of the main correction mechanism so as to correct the image capturing range of the image capturing assembly to a true position;

correcting operation position of the wafer locating member installation/uninstallation mechanism, the first robotic arm driving the wafer locating member installation/uninstallation mechanism to move to the upper side of the main correction mechanism so as to adjust and correct the operation position of the wafer locating member installation/uninstallation mechanism, the control module comparing the operation position of the wafer locating member installation/uninstallation mechanism with the image capturing range of the image capturing assembly and storing a relative position coordinate therebetween;

making the image capturing assembly truly correspond to the wafer disc, the first robotic arm driving the image capturing assembly to move to the upper side of the carrier disc and correct the position to precisely correspond to the wafer discs on the carrier disc so as to check the condition on the wafer disc;

making the wafer locating member installation/uninstallation mechanism take off the wafer locating member from the wafer disc, with reference to the relative position coordinate, the control module driving the first robotic arm to drive the wafer locating member installation/uninstallation mechanism to be aligned with the wafer disc and take out the wafer locating member previously disposed on the wafer disc;

correcting the operation position of the wafer taking/placing mechanism, the second robotic arm driving the wafer taking/placing mechanism to move to the upper side of the main correction mechanism so as to correct the operation position of the wafer taking/placing mechanism;

making the wafer taking/placing mechanism place the wafer to be processed onto the wafer correction mechanism, the second robotic arm driving the wafer taking/placing mechanism to move into the material rest mechanism to take out the wafer to be processed and place the wafer to be processed into the wafer correction mechanism;

making the wafer taking/placing mechanism read the code of the wafer to be processed and rotate the notch of the wafer to be processed to a true angle, the wafer correction mechanism obtaining the code and the position of the wafer to be processed and the wafer to be processed being rotated so as to adjust the wafer to be processed to a true position;

making the wafer taking/placing mechanism move the wafer to be processed onto the wafer disc, the second robotic arm driving the wafer taking/placing mechanism to take out the wafer to be processed from the wafer correction mechanism and place the wafer onto the wafer disc of the carrier disc;

making the image capturing assembly obtain the image of the wafer to be processed, the first robotic arm driving the image capturing assembly to move to the upper side of the carrier disc and obtain the image of the wafer to be processed, which is previously placed on the wafer disc so as to ensure that the wafer to be processed is complete; and making the wafer locating member installation/uninstallation mechanism install the wafer locating member on the wafer disc to secure the wafer to be processed, the first robotic arm driving the wafer locating member installation/uninstallation mechanism to connect the wafer locating member on the wafer disc, the wafer locating member pressing the wafer to be processed so as to locate the same, then the control module driving the carrier disc to move to a predetermined position to be processed.

18. An installation method employing the wafer carrier disc installation/uninstallation device as claimed in claim 1, comprising steps of:

correcting image capturing range of the image capturing assembly, the first robotic arm driving the image capturing assembly to move to the upper side of the main correction mechanism so as to correct the image capturing range of the image capturing assembly to a true position;

correcting operation position of the wafer locating member installation/uninstallation mechanism, the first robotic arm driving the wafer locating member installation/uninstallation mechanism to move the locating face thereof to the upper side of the main correction mechanism so as to adjust and correct the operation position of the wafer locating member installation/uninstallation mechanism, the control module comparing the operation position of the wafer locating member installation/uninstallation mechanism with the image capturing range of the image capturing assembly and storing a relative position coordinate therebetween;

making the image capturing assembly truly correspond to the wafer disc, the first robotic arm driving the image capturing assembly to move to the upper side of the carrier disc and correct the position to precisely correspond to the wafer discs on the carrier disc so as to check the condition on the wafer disc;

making the wafer locating member installation/uninstallation mechanism take off the wafer locating member from the wafer disc, with reference to the relative position coordinate, the control module driving the first robotic arm to drive the wafer locating member installation/uninstallation mechanism so as to make the locating face aligned with the wafer disc and take out the wafer locating member previously disposed on the wafer disc;

correcting the operation position of the wafer taking/placing mechanism, the second robotic arm driving the wafer taking/placing mechanism to move to the upper side of the main correction mechanism so as to correct the operation position of the wafer taking/placing mechanism;

making the wafer taking/placing mechanism place the wafer to be processed onto the wafer correction mechanism, the second robotic arm driving the wafer taking/placing mechanism to move into the material rest mechanism to take out the wafer to be processed and place the wafer to be processed into the wafer correction mechanism;

making the wafer taking/placing mechanism read the code of the wafer to be processed and rotate the notch of the wafer to be processed to a true angle, the wafer correction mechanism obtaining the code and the position of the wafer to be processed and the wafer to be processed being rotated so as to adjust the wafer to be processed to a true position;

making the wafer taking/placing mechanism move the wafer to be processed onto the wafer disc, the second robotic arm driving the wafer taking/placing mechanism to take out the wafer to be processed from the wafer correction mechanism and place the wafer onto the wafer disc of the carrier disc;

making the image capturing assembly obtain the image of the wafer to be processed, the first robotic arm driving the image capturing assembly to move to the upper side of the carrier disc and obtain the image of the wafer to be processed, which is previously placed on the wafer disc so as to ensure that the wafer to be processed is complete; and making the wafer locating member installation/uninstallation mechanism install the wafer locating member on the wafer disc to secure the wafer to be processed, the first robotic arm driving the wafer locating member installation/uninstallation mechanism to connect the wafer locating member on the wafer disc, the wafer locating member pressing the wafer to be processed so as to locate the same, then the control module driving the carrier disc to move to a predetermined position to be processed.

19. An uninstallation method employing the wafer carrier disc installation/uninstallation device as claimed in claim 2, comprising steps of:

correcting image capturing range of the image capturing assembly, before the carrier disc, on which the processed wafer has been placed, is moved from the outer side back to the lower side of the outer cover, the first robotic arm driving the image capturing assembly to move to the upper side of the main correction mechanism so as to correct the image capturing range of the image capturing assembly to a true position;

correcting operation position of the wafer locating member installation/uninstallation mechanism, the first robotic arm driving the wafer locating member installation/uninstallation mechanism to move to the upper side of the main correction mechanism so as to adjust and correct the operation position of the wafer locating member installation/uninstallation mechanism, the control module comparing the operation position of the wafer locating member installation/uninstallation mechanism with the image capturing range of the image capturing assembly and storing a relative position coordinate therebetween;

correcting the operation position of the wafer taking/placing mechanism, the second robotic arm driving the wafer taking/placing mechanism to move to the upper side of the main correction mechanism so as to correct the operation position of the wafer taking/placing mechanism;

making the image capturing assembly truly correspond to the wafer disc, after the carrier disc, on which the processed wafer is placed, is moved from the outer side back to the lower side of the outer cover, the first robotic arm driving the image capturing assembly to move to the upper side of the carrier disc and correct the position to precisely correspond to the wafer discs on the carrier disc so as to check the condition of the processed wafer on the wafer disc;

making the wafer locating member installation/uninstallation mechanism take off the wafer locating member from the wafer disc, with reference to the relative position coordinate, the control module driving the first robotic arm to drive the wafer locating member installation/uninstallation mechanism to be aligned with the wafer disc and take out the wafer locating member disposed on the wafer disc to secure the processed wafer;

making the wafer taking/placing mechanism take off the processed wafer from the wafer disc and making the wafer correction mechanism read the code of the processed wafer, the second robotic arm driving the wafer taking/placing mechanism to move to the upper side of the wafer disc of the carrier disc to take out the processed wafer and place the processed wafer into the wafer correction mechanism so as to read the code of the processed wafer; and making the wafer taking/placing mechanism place the wafer into the material rest mechanism, the wafer taking/placing mechanism moving the processed wafer into the material rest mechanism.

20. An uninstallation method employing the wafer carrier disc installation/uninstallation device as claimed in claim 1, comprising steps of:

correcting image capturing range of the image capturing assembly, before the carrier disc, on which the processed wafer has been placed, is moved from the outer side back to the lower side of the outer cover, the first robotic arm driving the image capturing assembly to move to the upper side of the main correction mechanism so as to correct the image capturing range of the image capturing assembly to a true position;

correcting operation position of the wafer locating member installation/uninstallation mechanism, the first robotic arm driving the wafer locating member installation/uninstallation mechanism to move the locating face thereof to the upper side of the main correction mechanism so as to adjust and correct the operation position of the wafer locating member installation/uninstallation mechanism, the control module comparing the operation position of the wafer locating member installation/uninstallation mechanism with the image capturing range of the image capturing assembly and storing a relative position coordinate therebetween;

correcting the operation position of the wafer taking/placing mechanism, the second robotic arm driving the wafer taking/placing mechanism to move to the upper side of the main correction mechanism so as to correct the operation position of the wafer taking/placing mechanism;

making the image capturing assembly truly correspond to the wafer disc, after the carrier disc, on which the processed wafer is placed, is moved from the outer side back to the lower side of the outer cover, the first robotic arm driving the image capturing assembly to move to the upper side of the carrier disc and correct the position to precisely correspond to the wafer discs on the carrier disc so as to check the condition of the processed wafer on the wafer disc;

making the wafer locating member installation/uninstallation mechanism take off the wafer locating member from the wafer disc, with reference to the relative position coordinate, the control module driving the first robotic arm to drive the wafer locating member installation/uninstallation mechanism so as to make the locating face aligned with the wafer disc and take out the wafer locating member disposed on the wafer disc to secure the processed wafer;

making the wafer taking/placing mechanism take off the processed wafer from the wafer disc and making the wafer correction mechanism read the code of the processed wafer, the second robotic arm driving the wafer taking/placing mechanism to move to the upper side of the wafer disc of the carrier disc to take out the processed wafer and place the processed wafer into the wafer correction mechanism so as to read the code of the processed wafer; and making the wafer taking/placing mechanism place the wafer into the material rest mechanism, the wafer taking/placing mechanism moving the processed wafer into the material rest mechanism.

* * * * *